United States Patent [19]
Maimone et al.

[11] Patent Number: 5,893,102
[45] Date of Patent: Apr. 6, 1999

[54] TEXTUAL DATABASE MANAGEMENT, STORAGE AND RETRIEVAL SYSTEM UTILIZING WORD-ORIENTED, DICTIONARY-BASED DATA COMPRESSION/ DECOMPRESSION

[75] Inventors: William D. Maimone, Birdsboro, Pa.; Albert B. Cooper, New York City, N.Y.

[73] Assignee: Unisys Corporation, Blue Bell, Pa.

[21] Appl. No.: 761,252

[22] Filed: Dec. 6, 1996

[51] Int. Cl.[6] .................................................. G06F 17/30
[52] U.S. Cl. .............................. 707/101; 707/2; 707/3; 707/102; 341/51
[58] Field of Search .................................. 707/101, 102, 707/3, 2; 341/51, 55, 67

[56] References Cited

U.S. PATENT DOCUMENTS

| | | | |
|---|---|---|---|
| 5,051,745 | 9/1991 | Katz | 341/51 |
| 5,151,697 | 9/1992 | Bunton | 341/51 |
| 5,179,378 | 1/1993 | Ranganathan et al. | 341/51 |
| 5,379,036 | 1/1995 | Storer | 341/51 |
| 5,406,281 | 4/1995 | Klayman | 341/51 |
| 5,412,384 | 5/1995 | Chang et al. | 341/79 |
| 5,532,694 | 7/1996 | Mayers et al. | 341/67 |
| 5,534,861 | 7/1996 | Chang et al. | 341/79 |
| 5,590,317 | 12/1996 | Iguchi et al. | 395/602 |
| 5,592,667 | 1/1997 | Bugajski | 395/613 |
| 5,691,717 | 11/1997 | Tamura | 341/50 |
| 5,737,733 | 4/1998 | Eller | 707/3 |
| 5,745,898 | 4/1998 | Burrows | 707/101 |
| 5,745,899 | 4/1998 | Burrows | 707/102 |
| 5,752,020 | 5/1998 | Ando | 395/604 |
| 5,765,158 | 6/1998 | Burrows | 707/101 |
| 5,765,168 | 6/1998 | Burrows | 707/200 |
| 5,781,906 | 7/1998 | Aggarwal et al. | 707/102 |
| 5,787,435 | 7/1998 | Burrows | 707/102 |
| 5,809,502 | 9/1998 | Burrows | 707/7 |
| 5,819,260 | 10/1998 | Lu et al. | 707/3 |

FOREIGN PATENT DOCUMENTS

| | | |
|---|---|---|
| 350 281 B1 | 10/1990 | European Pat. Off. . |
| 92/1595 | 9/1992 | WIPO . |

OTHER PUBLICATIONS

Shang et al. "Tries for Approxmate String Matching" IEEE Transactions on Knowledge and Data Engineering, vol. 8, No. 4, Aug. 1996, pp. 540–547.

Gavish "Match–Length Functions for Data Compression-"IEEE Transactions on Information Theory, vol. 42, No. 5, Sep. 1996, pp. 1375–1380.

Inglis et al. "Compression–Based Template Matching" IEEE, 1994, pp. 106–115.

Bshouty et al. "Compression of Dictionaries viea Extensions to Front Coding", IEEE, 1992, pp. 361–364.

*Primary Examiner*—Paul V. Kulik
*Assistant Examiner*—Michael J. Wallace, Jr.
*Attorney, Agent, or Firm*—Albert B. Cooper; Mark T. Starr; Steven B. Samuels

[57] ABSTRACT

Using LZW data compression/decompression processing techniques, textual input data is compressed by parsing consecutive words of the text into phrases and storing the phrases in a dictionary with compressed phrase codes associated therewith. The textual input data is searched by determining the longest match with the stored phrases in the dictionary and the compressed phrase code associated with the longest match is output to a compressed text database and stored at a location thereof. A list of references is maintained associated with each stored phrase to the locations in the compressed text database at which the compressed phrase code for the phrase is stored. Lists of word-to-phrase references are also created providing references for each distinct word encountered in the text to the stored phrases containing the word. Textual queries applied against the compressed text database utilize the dictionary and reference lists to access compressed database references and to decompress text in both directions from a referenced compressed text database location in order to provide information relative to the query.

49 Claims, 9 Drawing Sheets

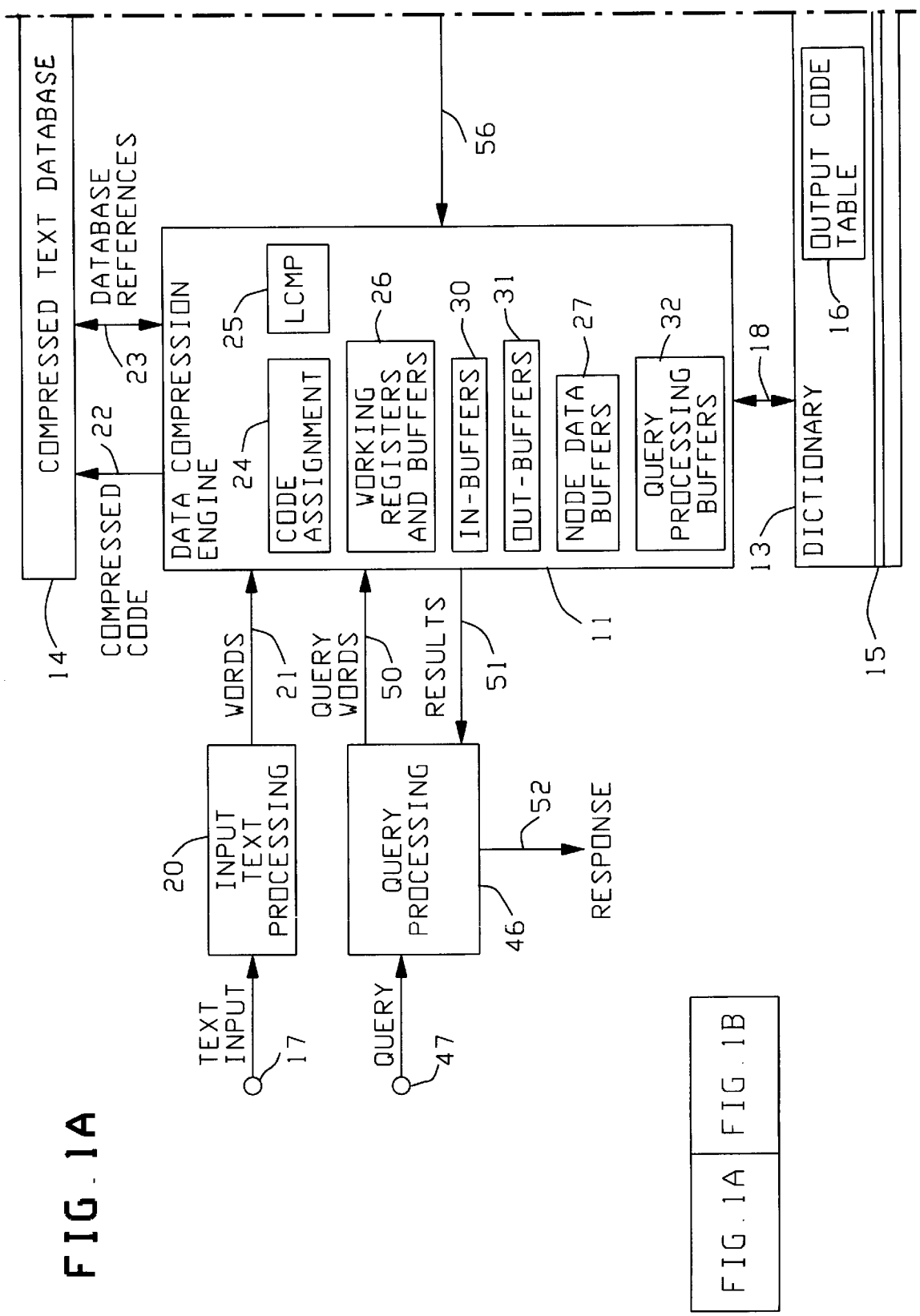

5,893,102

TEXTUAL DATABASE MANAGEMENT, STORAGE AND RETRIEVAL SYSTEM UTILIZING WORD-ORIENTED, DICTIONARY-BASED DATA COMPRESSION/ DECOMPRESSION

BACKGROUND OF THE INVENTION

1. Field of the Invention

The invention relates to storage and retrieval of large amounts of textual information including the application of textual queries against a compressed textual database.

2. Description of the Prior Art

Large textual databases are known that store vast amounts of information. For example, databases exist that store the full text of U.S. patents that have issued over the past forty to fifty years. Queries, such as searches, can be made against such databases to retrieve particular information such as all of the patents that contain a user supplied search key. Such a search key can be an English language phrase or a sequence of English words or phrases separated by relational operators such as AND, OR, NOT, WITHIN (N) and the like. As another example, the telephone companies maintain large databases of customer information utilized, for example, in call validation and billing procedures.

Dictionary based data compression/decompression systems are known that compress input text into compressed code and recover the input text by decompressing the compressed code. Such systems are character oriented, in that strings of input characters are absorbed into the compressor and translated into corresponding compressed code symbols. For example, the compression might be performed over an alphabet comprising the 256 ASCII characters. Such data compression/decompression techniques are exemplified by the well-known LZW procedure of U.S. Pat. No. 4,558,302 by Welch, issued Dec. 10, 1985. Another character oriented data compression/decompression algorithm, known as LZ2, is described in a paper entitled "Compression Of Individual Sequences Via Variable-Rate Coding" by J. Ziv and A. Lempel, published in the IEEE Transactions On Information Theory, Vol. IT-24, No. 5, September 1978, pages 530–536. Further character oriented compression and decompression techniques are described in U.S. Pat. No. 4,876,541 by Storer, issued Oct. 24, 1989; U.S. Pat. No. 4,465,650 by Eastman et al., issued Aug. 7, 1984; U.S. Pat. No. 4,814,746 by Miller et al., issued Mar. 21, 1989; U.S. Pat. No. 5,087,913 by Eastman, issued Feb. 11, 1992; U.S. Pat. No. 5,153,591 by Clark, issued Oct. 6, 1992; and U.S. Pat. No. 5,373,290 by Lempel et al., issued Dec. 13, 1994.

The above-described character oriented data compression/decompression procedures may be applied to a large textual database so as to generate a compressed version of the database for more efficient storage or transmission. Heretofore, in order to apply a textual query against a database, the database must be in uncompressed form. Thus, a mass database would be compressed for archival or transmission purposes, but the entire database would be decompressed or exist in original uncompressed form for active query usage. Additionally, the compression/decompression dictionaries constructed in the compression/decompression procedures are only used in the archival or transmission compression/decompression activities and are not used, on line, in active database usage.

It is appreciated that the efficient storage and retrieval of large amounts of textual information is a problem encountered by on-line services, CDROM-based information products and document delivery systems. The problem is encountered with respect to storage and retrieval of textual information based upon a user request or query.

SUMMARY OF THE INVENTION

It would be desirable in the prior art systems to perform active database functions, such as query management, using the database in its compressed form. It would, furthermore, be desirable to utilize the compression dictionary to perform active functions against the database instead of limiting the dictionary use only to archiving and database transmission functions. Using the dictionary in active query handling can provide searching economies since the statistics of the data is inherent in the dictionary.

These desiderata are achieved by a data compression/decompression system that uses a dictionary-based data compression algorithm that conventionally operates upon input characters to form strings of characters stored in the dictionary. Instead of characters and strings, the algorithm is applied to input words to form phrases of words stored in the dictionary. When a phrase is matched in the dictionary, the compressed code corresponding to the phrase is placed in the compressed output text and a reference to the location in the output text is stored in the dictionary with the phrase. Additionally, the dictionary stores references indicating the phrases in which a word appears. Preferably, these word-to-phrase references are stored with the corresponding single word phrase in the dictionary. The words of an uncompressed query are applied to the dictionary to obtain the phrase and compressed text references so as to obtain information relative to the query. Uncompressed text is retrieved from the compressed database on either side of a particular stored compressed code by using the dictionary to decompress the particular stored. compressed code and the stored compressed codes on either side thereof.

DESCRIPTION OF THE PREFERRED EMBODIMENT

Figure 1B:
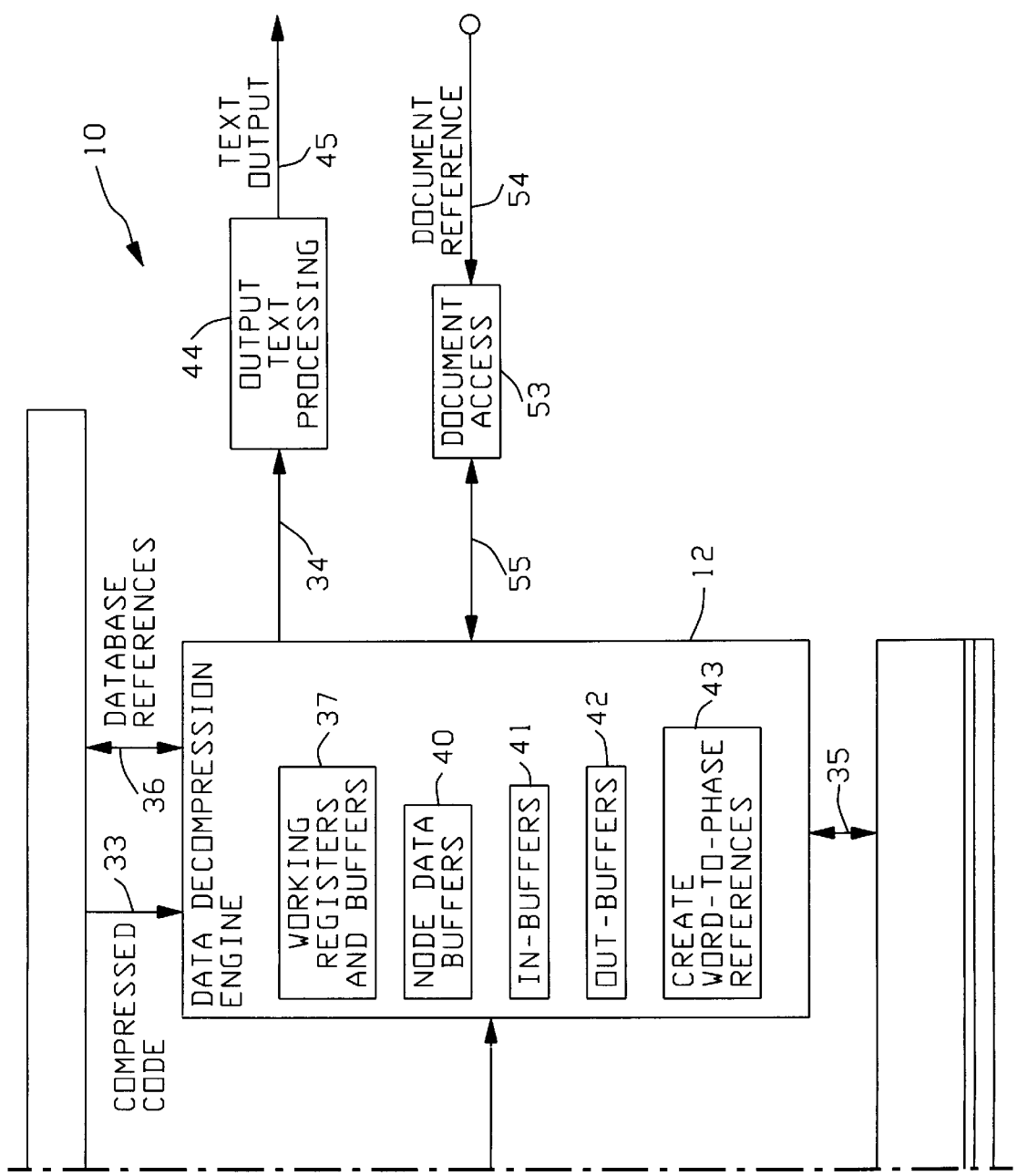
FIG. 1 is a schematic block diagram of a textual database system configured in accordance with the invention.

Referring to FIG. 1, a schematic block diagram of a textual database system 10 configured in accordance with the invention is illustrated. The system 10 includes a data compression engine 11, a data decompression engine 12, a compressed text database 14 and a dictionary 13 for storing a searchtree database. The data compression engine 11 and data decompression engine 12 operate in a manner similar to that described in said U.S. Pat. No. 4,558,302 and the dictionary 13 stores the searchtree database in a manner similar to that described in said U.S. Pat. No. 5,153,591. In the patents cited above, data compression/decompression is performed with respect to characters where a character is the smallest unit of information considered. Typically, a character may be one of the ASCII characters over the 256 character ASCII alphabet, or a character can be a binary bit over the two character binary alphabet comprising the characters binary one and binary zero. In the cited patents, a data compressor forms strings of characters which are stored in a dictionary and encoded. A data decompressor recovers the characters from the encoded stored strings.

In the present invention, the data compression engine 11 operates upon words as the smallest unit of information forming phrases of the words which are encoded and stored in the dictionary 13. The data decompression engine 12 recovers the words of a phrase stored in the dictionary 13. The data compression engine 11 operates upon words to form phrases whereas the data compressors of the cited patents operate upon characters to form strings. The data decompression engine 12 operates to recover the words comprising an encoded phrase whereas the data decompressors of the cited patents operate upon encoded strings to recover the characters thereof. The dictionary 13 stores phrases comprised of words in a searchtree database of the type described in the cited patents that is utilized by the dictionaries thereof to store strings of characters.

The data compression engine 11 and data decompression engine 12 will be exemplified as performing LZW compression/decompression as described in said U.S. Pat. No. 4,558,302, except that in the present invention the algorithms are performed with respect to words and phrases. The dictionary 13 will be exemplified as storing the searchtree described in said U.S. Pat. No. 5,153,591, except that in the present invention the searchtree will store phrases comprising words. Further details of the operations performed by the data compression engine 11 and the data decompression engine 12 will be given below.

The searchtree database in the dictionary 13 is stored at nodes, one of which is schematically represented at 15. An output code table 16, to be later described, is stored in the dictionary 13 for convenience. Details of the searchtree database stored in the dictionary 13 and of the data structure of the node 15 will be described below.

Input text to be compressed is applied at an input 17 to an input text processing section 20. An example of the type of data that may be input is the full text of all the U.S. patents issued over the past forty to fifty years. The input text processing section 20 processes the raw text to provide a stream of the individual words thereof to the data compression engine 11 on a path 21. This is a known function of compilers at run time utilizing string functions. For example, the function fscanf might be utilized to implement the input text processing section 20 to parse input text into words. The string functions might encompass such capability as include all characters in the group a-z or A-Z. Characters can also be skipped using such string functions. The regexp set of functions can also be used to parse input text into words using normal expressions which allow for the description of the composition of words comprising characters, e.g., A-Za-z.

In the preferred embodiment of the invention the input text processing section 20 formats inter-word symbology into separate words and provides these words in the appropriate textual sequence on the path 21. Such inter-word symbology may include spaces, punctuation, as well as non-printable formatting characters such as tabs, carriage returns and page breaks. String functions in the input text processing section 20 are readily provided to perform this function. These inter-word words are generated to provide lossless compression/decompression. Such words, although included in the searchtree, may be specially flagged so that they can be skipped over in a query search through the tree.

Figure 4:
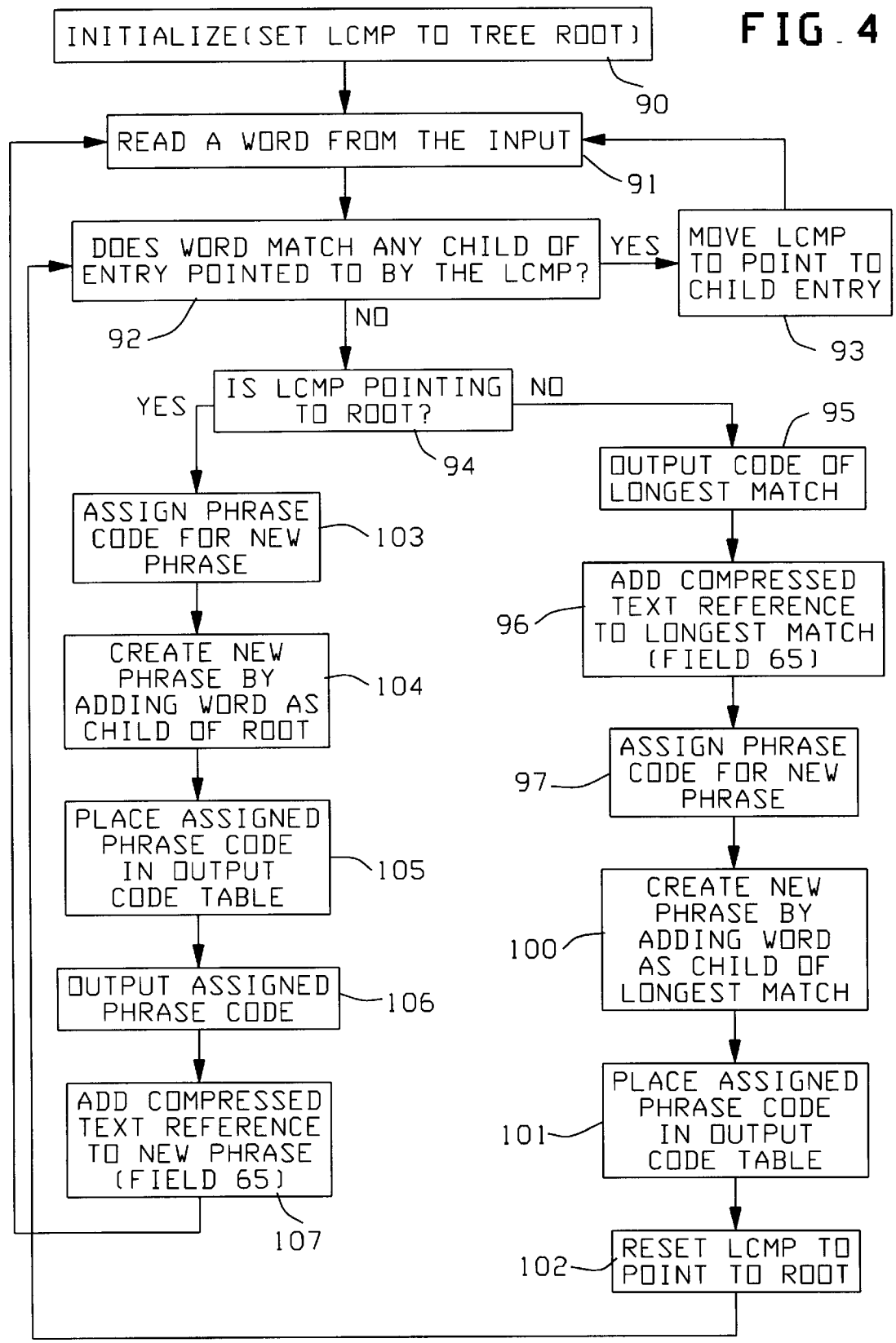
FIG. 4 is a flow chart diagram illustrating the operations performed by the system of FIG. 1 in compressing textual data and constructing the searchtree of FIG. 3.

The data compression engine 11 parses the words on the path 21 into word phrases utilizing the algorithm to be described with respect to FIG. 4. A phrase code is assigned to each phrase and these compressed phrase codes are stored in the compressed text database 14 via a path 22. The data compression engine 11 stores phrases in the dictionary 13 in a searchtree database in a manner to be described. The data compression engine 11 utilizes the stored phrases in the searchtree database in the dictionary 13 to parse the words on the path 21 into the word phrases, thereby compressing the input words into the compressed code signals on the path 22.

Thus, as consecutive phrases are parsed from the input words on the path 21, corresponding consecutive phrase codes are stored in the compressed text database 14. The compressed phrase codes are stored in the compressed text database 14 at locations referenced to the database. For example, if the compressed text database 14 is stored on a multi-disk system, a compressed phrase code may be stored in a file. at a byte depth into the file or, alternatively, at a particular disk, track, sector coordinate of the disk storage system. The database reference location at which a compressed phrase code is stored is returned to the data compression engine 11 on a path 23 and is stored with the corresponding phrase in the dictionary 13 in a manner to be further described.

The data compression engine 11 utilizes several support components to perform the data compression operations to be described below. The data compression engine 11 includes a code assignment component 24 for assigning the compressed phrase codes to the stored phrases. In a manner to be further detailed, the data compression engine 11 utilizes a moving pointer that points to a longest current match. A longest current match pointer (lcmp) register 25 is utilized to hold this pointer. Working registers and buffers 26 are included to provide temporary and intermediate storage as required in performing the data compression process. Node data buffers 27 are included for temporary storage of node data as a searchtree node is being processed.

In-buffers 30 are utilized to transiently store input data being processed. For example, a word from the path 21 being examined by the data compression engine 11 would be stored in in-buffers 30. Similarly, out-buffers 31 are utilized to transiently store outputs from the data compression engine 11. For example, the compressed phrase codes applied to the path 22 are temporarily held in out-buffers 31. The data compression engine 11 also includes query processing buffers 32 for temporarily storing data with respect to query processing to be described. Data communication between the data compression engine 11 and the dictionary 13 is effected over a path 18.

As discussed above, the compressed text database 14 stores the compressed phrase codes. The data decompression engine 12 decompresses a compressed phrase code from the compressed text database 14 provided via a path 33. The data decompression engine 12 provides the recovered words of the phrase represented by the code on an output 34. The data decompression engine 12 uses the searchtree database stored in the dictionary 13 to perform the data decompression in accordance with the algorithm to be described below with respect to FIG. 5. Data communication between the data decompression engine 12 and the dictionary 13 is effected over a path 35. Database location references are transmitted between the data decompression engine 12 and the compressed text database 14 via a path 36.

The data decompression engine 12 includes support components in a manner similar to that described with respect to the data compression engine 11. The data compression engine 12 includes working registers and buffers 37 for temporary storage of data as the data decompression engine 12 performs the decompression functions to be described. The data decompression engine 12 includes node data buffers 40 for temporarily holding data from the nodes of the searchtree database stored in the dictionary 13 in performing the data decompression processes to be described.

The data decompression engine 12 also includes in-buffers 41 for temporarily holding input data to be processed by the data decompression engine 12. For example, compressed phrase codes provided on the path 33 are held in in-buffers 41 for processing. Also included are out-buffers 42 for temporarily holding output data of the data decompression engine 12. For example, output words applied to the path 34 are held in out-buffers 42.

Figure 6:
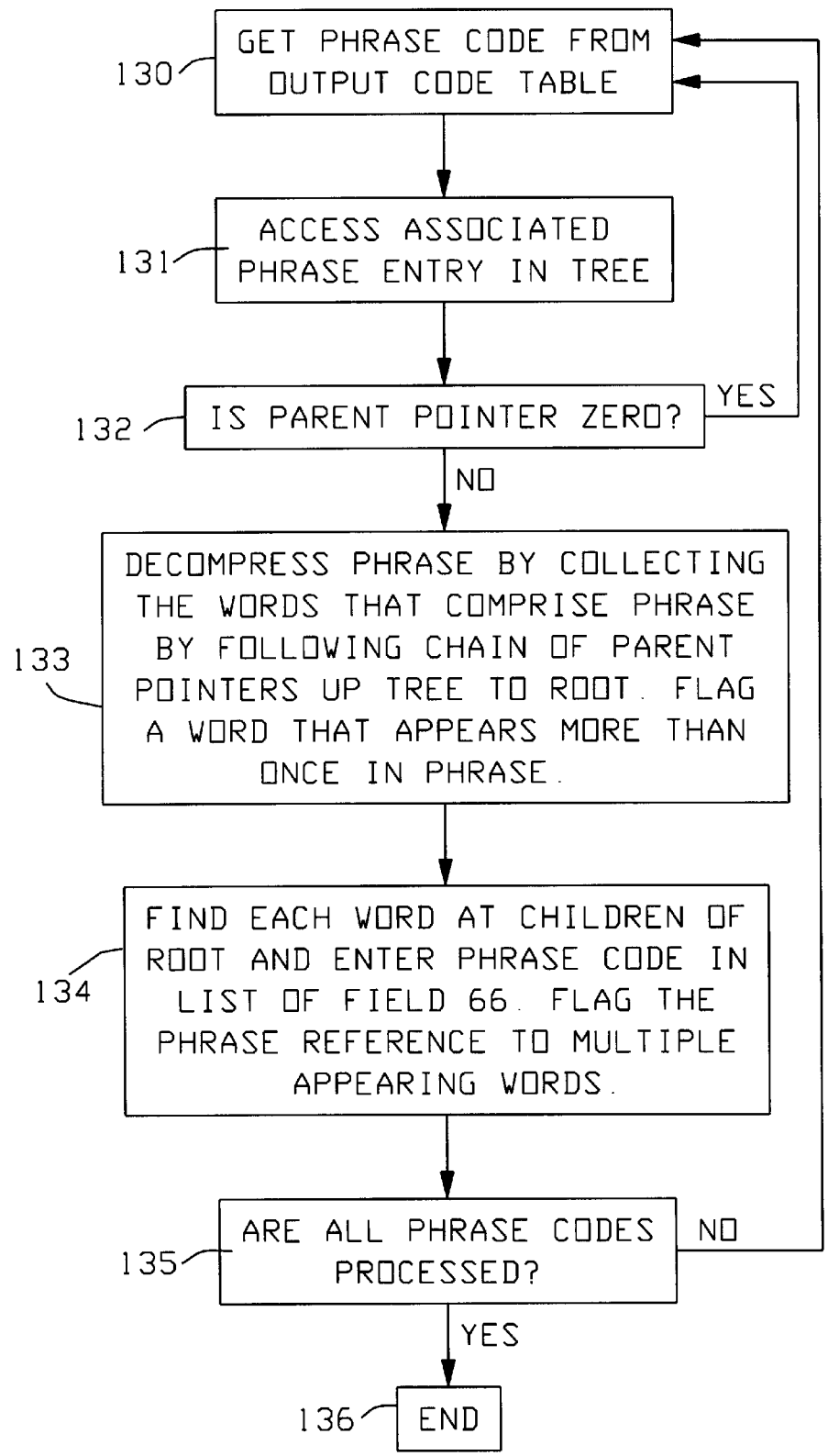
FIG. 6 is a flow chart diagram illustrating the operations of the "create word-to-phrase references" component of FIG. 1.

The data decompression engine 12 also includes a component 43 for creating word-to-phrase references in a manner to be described with respect to FIG. 6. The word-to-phrase references are stored in the searchtree database in the dictionary 13 in a manner to be discussed.

The system 10 includes an output text processing section 44 which receives the words provided by the data decompression engine 12 on the path 34 and provides text output on an output path 45. The output text processing section 44 performs any system protocols required in order to provide lossless data recovery. For example, as discussed above, the input text processing section 20 extracts the words from the input text and provides these words on the path 21. Further, as discussed, the input text processing section 20 formulates, as special words, the inter-word symbology, such as spaces, punctuation and formatting symbology. For overhead economy, a protocol may be utilized in the input text processing section 20 that would discard the single space that normally exists between most words. The output text processing section 44 would then reconstruct the original text by reinserting a single space between the regular words flowing on the path 34. The special words discussed above would, in the normal operation of decompression, provide the other inter-word symbology.

The system 10 further includes a query processing section 46 that receives queries at an input 47. The query processing section 46 provides appropriate processing of formatted queries and provides the management of relational operators such as AND, OR, NOT, and WITHIN (N). The query processing section 46 provides the words of the query to the data compression engine 11 on a path 50. The data compression engine 11 provides results of the query to the query processing section 46 on a path 51. The query processing section 46 processes the results on the path 51 into a response to the query provided on an output path 52. More detailed operation of the query processing section 46 will be exemplified below with respect to FIG. 8.

If the input text comprises multiple input documents, the query processing section 46 is augmented to contain document identification information relative to the database references. For example, if the input text comprises all issued U.S. patents over a particular time interval, the patent numbers are cross-referenced to the database references in a look up table (not shown) in the query processing section 46.

The system 10 further includes a document access section 53 that can access a particular document stored in the compressed text database 14. A reference to the document is applied at an input 54. Appropriate information is applied to the data decompression engine 12 via a path 55 and the data decompression engine 12 operates so that the appropriate document text is provided on the output 45. For example, the document access section 53 may contain a look-up table similar to the one discussed above cross-referencing document identification with database references. The document reference applied at the input 54 results in all of the database references applicable thereto to be applied to the data decompression engine 12 via the path 55. These database references are buffered in in-buffers 41. The data decompression engine 12 applies each of these database references on the path 36 to the compressed text database 14 and the database 14 returns the corresponding compressed phrase code on the path 33 to the data decompression engine 12. The data compression engine 12 then recovers the words of the phrase corresponding to the returned compressed phrase code and the output text processing section 44 formats the words into the appropriate output text on the path 45.

In any operations discussed herein where communication is required between the data compression engine 11 and the data decompression engine 12, a path 56 is utilized for such communication.

Figure 2:
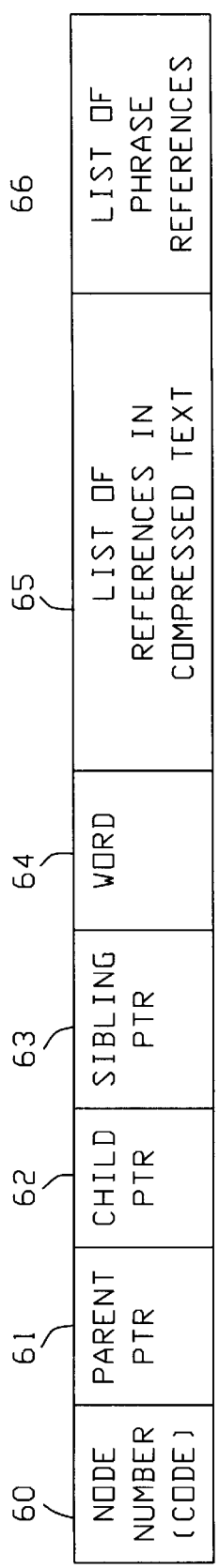
FIG. 2 is a schematic diagram of the data structure of the node of the searchtree stored in the dictionary of FIG. 1.

Referring to FIG. 2, a schematic diagram of the data structure of the node of the searchtree stored in the dictionary 13 of FIG. 1 is illustrated. As indicated above, the data structure of the searchtree and of the searchtree node is based on said U.S. Pat. No. 5,153,591. A node of the searchtree is indicated by reference numeral 15 as indicated in FIG. 1. The node 15 contains a node number 60 which, for convenience, is utilized as the compressed code of a stored phrase as will be further discussed. Fields 61, 62 and 63 store pointers to the node parent, node child and node sibling, respectively. A field 64 stores the word represented by the node. A field 65 contains a list of database references to the compressed text database 14. Each database reference in the list of field 65 references a location in the compressed text database 14 that contains a phrase code of a phrase that ends with the word contained in the field 64. These phrases are both multiple word phrases as well as the single word phrases that comprise the single word contained in the field 64. With respect to the single word phrases, the database reference location contains the compressed phrase code assigned to the word. The list of field 65 is constructed in the manner described below with respect to FIG. 4.

For convenience, the tree nodes that store the children of the tree root include a field 66 that contains a list of phrase references to phrases that contain the word stored in field 64. The list of field 66 contains the phrase codes of the phrases that include the word of the field 64. The list of the field 66 is constructed in a manner to be described with respect to FIG. 6.

It is appreciated that the data structure illustrated for the nodes of the searchtree may require multiple locations in the memory storing the dictionary 13. For example, the field 64 must be sufficiently large to contain any word in, for example, the English language. The field 64 thus may itself require a memory location. This is also the case for the lists of fields 65 and 66 and for the code and pointers of fields 60–63. The memory in which the dictionary 13 is contained therefore includes a conventional directory structure (not shown) that will cross-reference all of the memory locations belonging to a particular node number (code).

Figure 3:
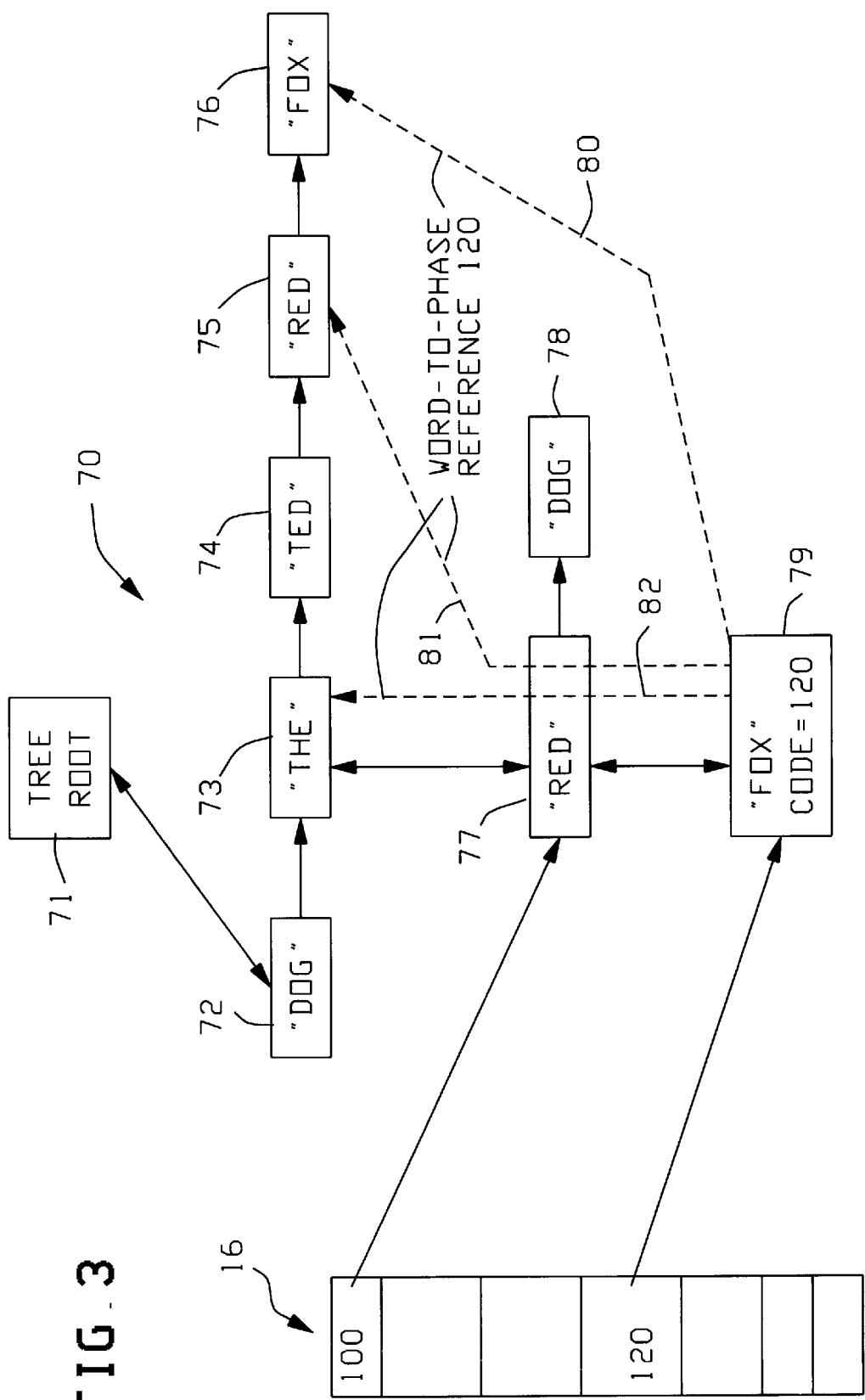
FIG. 3 is a schematic diagram illustrating the data structure of the searchtree stored in the dictionary of FIG. 1.

Referring to FIG. 3, with continued reference to FIG. 2, the data structure of the searchtree stored in the dictionary 13 of FIG. 1 is illustrated. A searchtree is exemplified by reference numeral 70. FIG. 3 also illustrates the structure of output code table 16 and the relationship to the searchtree 70. The tree 70 is illustrated with a tree root node 71 and further nodes 72–79. The nodes 72–76 are the children of the tree root 71. The nodes 77 and 78 are the children of the node 73 and the node 79 is the child of the node 77. The nodes 72–76 are siblings of one another and the node 78 is a sibling of the node 77. The nodes 71–79 utilize the data structure described above with respect to FIG. 2. The tree root 71 has a node number of zero and all the fields thereof are null except for field 62. Field 62 of the tree root 71 contains the child pointer for the child represented by the node 72. Thus, the child pointer field 62 of the tree root node 71 contains the node number of node 72.

Each of the nodes 72–79 illustrate the value for the word stored in field 64 of the respective node. For example, the field 64 of node 72 will contain the value "dog". Since the nodes 72–76 are all children of the tree root 71 and are siblings with respect to each other, the sibling pointer field 63 of the node 72 is set to the node number of the node 73. In a like manner, the sibling pointer fields 63 of the nodes 73–75 point to the respective siblings as illustrated. Therefore, the sibling pointer fields 63 of the nodes 72–76 form a linked list of these nodes. The parent pointer fields 61 of the nodes 72–76 are set to zero thereby pointing to the tree root parent node 71.

It is appreciated therefore, that the child pointer node 62 of the node 73 points to the node number of node 77 while the child pointer field 62 of the node 77 points to the node number of the node 79. Similarly, the parent pointer field 61 of the node 79 contains the node number of the node 77 and the parent pointer field 61 of the node 77 contains the node number of the node 73. It is furthermore appreciated that the sibling pointer field 63 of the node 77 contains the node number of the node 78 and the parent pointer field 61 of the node 78 contains the node number of the node 73. Thus, nodes 77 and 78 are children of the node 73. The level of the tree 70 occupied by nodes 72–76 is the beginning of phrases and also stores the individual word entries that comprise single word phrases. Only the nodes 72–76 include the field 66 for storing the list of word-to-phrase references.

It is appreciated from the above that the tree 70 stores the single word phrases "dog", "The", "Ted", "red", and "fox". The tree 70 furthermore stores the phrases "The red", "The red fox", and "The dog". The phrase code that identifies a phrase, and which is stored in the compressed text database 14 to represent the phrase, is the node number of the tree entry that ends the phrase. The phrase "The red fox" is assigned the phrase code 120 as illustrated. Thus, the node number field 60 of node 79 contains the value 120.

The output code table 16 has an entry for each assigned phrase code and is utilized to point to the tree entry that ends the associated phrase. Thus, the phrase code table entry of 120 points to tree node 79.

The arrows 80–82 illustrate the manner in which the word-to-phrase references are stored in field 66 in the appropriate nodes of the root children. This will be further described with respect to FIG. 6.

Referring to FIG. 4, with continued reference to FIGS. 1–3, a flow chart illustrating the operations performed by the system of FIG. 1 in compressing textual data and constructing the searchtree of FIG. 3 is illustrated. The system is initialized for compression at a block 90 whereat the longest current match pointer (lcmp) register 25 of the data compression engine 11 is set to point to the tree root. In the example of FIG. 3, the lcmp register 25 is set to point to the root 71. At a block 91, an input word is read from input text processing 20 and is held in in-buffers 30.

At a block 92, the data compression engine 11 operates to determine if the input word matches any child of the tree node pointed to by lcmp. This matching operation is well understood in the data compression art. The data compression engine 11 utilizes the child pointer 62 of the node pointed to by lcmp and the sibling pointers 63 of the children nodes of the node pointed to by lcmp to perform this comparison. The data compression engine 11 extracts the appropriate nodes from the dictionary 13 temporarily storing the data in node data buffers 27. The input word in the in-buffers 30 is compared to the word value of the fields 64 of the accessed children nodes. In the example of FIG. 3, when lcmp points to the tree root 71, the nodes 72–76 are accessed using the appropriate child and sibling pointers and the word values thereof compared to the input word.

If a match is found at block 92, a branch is taken to a block 93 whereat the lcmp is moved to point to the matching child node. Thus, at the block 93, the node number in the field 60 of the matching child node is placed in the lcmp register 25.

The block 93 loops back to the block 91 and another word is read from the input. The described matching process of the block 92 is then performed with respect to the new input word for the children of the tree node now pointed to by lcmp. In the example of FIG. 3, if in the previous iteration the node 73 was matched, the lcmp would be moved from the node 71 to the node 73 and the comparison operation would be performed with respect to the nodes. 77 and 78.

The loop comprising blocks 91–93 is reiterated until at block 92 no child of the node pointed to by lcmp matches the input word. When this occurs, a branch is taken from block 92 to a block 94. At block 94 a test is performed to determine if lcmp is pointing to the tree root. This is accomplished by examining the contents of the lcmp register 25. If at the block 94 the lcmp is not pointing to the root, processing for a matched multi-word phrase is performed. If, however, lcmp is pointing to the root, the current input word is a word encountered for the first time by the system 10 and processing appropriate thereto is then performed.

When, at block 94, the lcmp is not pointing to the root, a branch is taken to a block 95. When processing attains the block 95, the data compression engine 11 has encountered at its input 21, the longest phrase that matches a phrase stored in the dictionary 13. The current input word at that time is the word that did not match any child of the node pointed to by lcmp at block 92. At block 95, the code of this longest matched phrase is output on the path 22 and stored in the compressed text database 14. The code that is output at block 95 is the node number in the field 60 of the node currently pointed to by lcmp. The compressed text database 14 returns the database reference, via the path 23, to the location in the database 14 whereat the output compressed code of block 95 is stored. In a block 96 this compressed text reference is added to the list stored in field 65 of the node representing the longest match. This is the node to which the lcmp register 25 is currently pointing.

At this point the dictionary 13 is updated with a new phrase. In a manner similar to LZW, the dictionary 13 is updated with a new phrase comprising the longest matched phrase extended by the word that caused the mismatch at block 92. Accordingly, at a block 97, a phrase code is assigned for the new phrase utilizing the code assignment component 24. At a block 100, the new phrase is created by adding the word that caused the mismatch as a child of the longest matched phrase.

The action of block 100 is accomplished by creating a new node in the dictionary 13 and entering the assigned phrase code into the node number field 60 thereof. The node number of the node representing the longest match (node pointed to by lcmp) is entered into the parent pointer field 61 of the newly created child node. The current input word, which caused the mismatch at block 92, is entered into the word field 64 of the newly created child node.

If the longest match node was previously childless, as indicated by a child pointer of zero in field 62 thereof, the node number of the newly created child is placed in the child pointer field 62 of this longest match parent node. If the longest match node previously had other children, as indicated by a non-zero child pointer in field 62 thereof, the newly created child node is entered into the sibling list of children of this longest match parent by adjusting the sibling pointers in the sibling pointer fields 63 of the previous children as well as entering an appropriate sibling pointer into the sibling pointer field 63 of the newly created child. The sibling list may be maintained in alphabetical order of the words that the children represent with appropriate adjustment of the sibling pointers at the alphabetical location of the sibling list where the new child node is inserted.

In a block 101, the phrase code assigned in block 97 is placed into the output code table 16 together with the address in the dictionary 13 at which the newly created child node is located.

It is appreciated that the data compression engine 11 utilizes the support components 24–27, 30 and 31 in performing the various operations of the blocks 95–97, 100 and 101. Thereafter, at a block 102, the lcmp register 25 is reset to point to the searchtree root node. Since the root node has a node number of zero, the lamp register 25 is reset to zero. Thereafter, control loops back to block 92.

The word operated upon at this time by the block 92 is the word that caused the mismatch in the search for the longest match that resulted in branching to block 95. The block 92 now determines if this word matches any current child of the root. By resetting the lcmp at the block 102 to point to the root and looping back to the block 92, the data compression engine 11 uses the word that caused the mismatch to begin the search for the next longest match after processing the current longest match via the blocks 95–97, 100 and 101.

If at the block 94, the lcmp is pointing to the root node, the current word is a word encountered for the first time by the data compression engine 11 and a single word phrase is created as a new child of the root. Accordingly, a branch is taken to a block 103 at which a new phrase code is assigned for the new phrase. As with block 97, the code assignment component 24 is utilized.

At a block 104, the new phrase is created by adding the word as a child of the root. This is accomplished by creating a new node in the dictionary 13 and placing the assigned phrase code as the node number in the node number field 60 thereof. The parent pointer field 61 of this new node is set to zero indicating that the parent is the tree root. The word that caused the mismatch at block 92 is entered into the word field 64 of this newly created node. If, at this time, the root node is childless (child pointer field 62 of the root node is zero), the node number of the newly created child is entered into the child pointer field 62 of the root. If, however, the root node already has children, the newly created node is linked with the other children of the root node by using the sibling pointer fields 63 of the other children nodes and the newly created node in the manner described above with respect to the block 100.

At a block 105, the assigned phrase code is placed in the output code table 16 together with the address in the dictionary 13 at which the newly created node is located.

At a block 106, the data compression engine 11 outputs the assigned phrase code to the compressed text database 14, via the path 22, for storage therein. The stored phrase code is a compressed code representation of the newly created single word phrase. At a block 107, a compressed text reference to the new phrase is added to the list in field 65 of the newly created child node. The compressed text database 14 returns this compressed text reference to the data compression engine 11, via the path 23, indicating the location in the database 14 at which the compressed code was stored. The data compression engine 11 enters this returned database reference into the list in the field 65 of the newly created child node stored in the dictionary 13. The block 107 loops back to the block 91 to read the next word from the input thereby beginning a next search with the input word following the word just processed by the blocks 103–107.

The data compression engine 11 utilizes the support components 24–27, 30 and 31 in performing the operations of the blocks 103–107.

When the input text to be compressed is exhausted, the following housekeeping operations (not shown) are performed. If the input is exhausted after performing block 93, operations similar to those described above with respect to blocks 95 and 96 are performed before processing is terminated. The output code is the contents of the lcmp register 25 and the longest match to which the text reference is added is the child node matched in block 92. If the input text is exhausted after performing block 107, processing is terminated.

The phrase codes assigned in blocks 97 and 103 by the code assignment component 24 of FIG. 1 may be assigned sequentially, thereby referring to sequential locations of the dictionary 13. Any other convenient code assignment protocol may be utilized including pseudorandom assignment.

Figure 5:
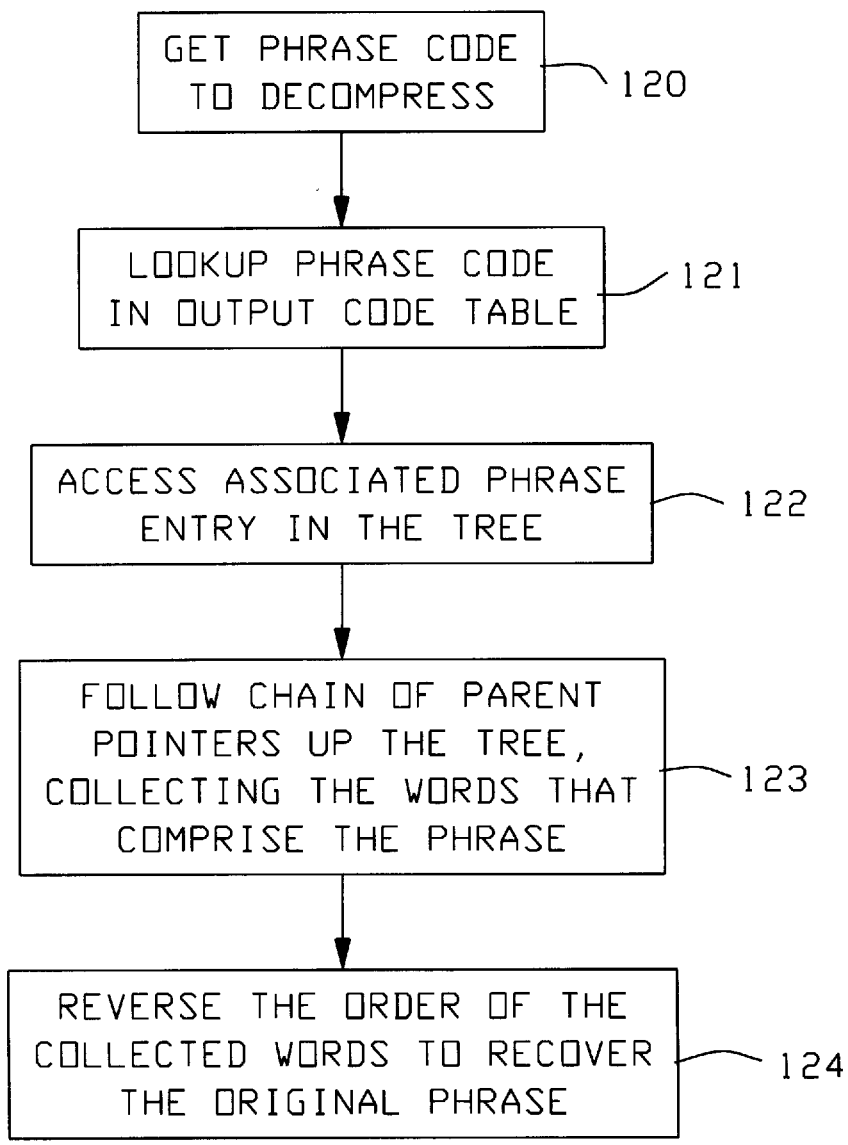
FIG. 5 is a flow chart diagram illustrating the operations utilized in decompressing compressed stored data to recover the original text.

Referring to FIG. 5, with continued reference to FIGS. 1–3, a flow chart of the operations performed by the data decompression engine 12 in decompressing a compressed stored phrase code to recover the original text is illustrated. At a block 120, the phrase code to be decompressed is obtained. The phrase code to be decompressed may be obtained from the compressed text database 14 via a path 33 and stored in in-buffers 41 for processing. At a block 121, the data decompression engine 12 looks up the phrase code in the output code table 16 and, at a block 122, accesses the associated phrase entry in the tree. As discussed above, the output code table 16 uses the phrase code being processed to point to the tree node in the dictionary 13 that ends the associated phrase.

At a block 123, the data decompression engine 12 follows the chain of parent pointers up the tree, collecting the words that comprise the phrase. Thus, the chain of parent pointers in the fields 61 of the tree nodes that comprise the phrase are followed and the words of the phrase are collected from the fields 64 of these nodes. The chain of parent pointers is followed from the node that ends the phrase up to and including the child of the root that begins the phrase. This beginning node is recognized by having a parent pointer of zero in the parent pointer field 61. The node data buffers 40 are utilized to hold the node data accessed from the dictionary 13 in the decompression process for performing the described operations thereon.

At a block 124, the order of the collected words is reversed to recover the original phrase. The working registers and buffers 37 are utilized for this purpose and the words of the recovered phrase are buffered through the out-buffers 42 to the path 34. Alternatively, the collected words may be output to the path 34 in the order collected and the output text processing section 44 may be utilized to perform the reversal.

Referring to FIG. 6, with continued reference to FIGS. 1–3, a flow chart diagram of the operations performed by the "create word-to-phrase references" component 43 of FIG. 1 is illustrated. After FIG. 4 has compressed all of the input text and stored the compressed text in the database 14, it is then desired to store references for each distinct word in the text to the phrases in which the word occurs. A convenient place to store such references is in the child node of the root that has the value of the word. Field 66 is utilized for this purpose. The flow diagram of FIG. 6 creates the word-to-phrase reference list for each distinct word of the text.

At a block 130, a phrase code is obtained from the output code table 16 and, at a block 131, the associated phrase entry in the tree is accessed. Block 131 is performed in the same manner as that described above with respect to block 122 of FIG. 5. At a block 132, a test is performed to determine if the parent pointer of the associated phrase entry in the tree is zero. If the parent pointer is zero, the associated phrase is a single word phrase represented by a child node of the tree root. In the case of such single word phrases, no entry in the word-to-phrase list is required since the phrase only contains the one word. Each single word phrase stored in the dictionary 13 already includes references to the database 14 as to the locations in the database 14 where the compressed code for the single word phrase is located. Fields 65 of the root children are populated with this information by operation of block 107 of FIG. 4 as described above. Accordingly, if the parent pointer is zero, a branch is taken back to block 130 to obtain the next phrase code.

If at block 132 the parent pointer is not zero, a branch is taken to a block 133 where the phrase is decompressed to collect the words that comprise the phrase. Decompression was discussed above with respect to FIG. 5. In FIG. 6, word order reversal is, however, not required. The words are collected by following the chain of parent pointers up the tree to the root. If a word appears in a phrase more than once, it will only be collected once, but the word will be flagged by logic (not shown) included in the component 43 of FIG. 1.

In a block 134, each word of the phrase is located in the root children nodes and the phrase code obtained in block 130 is entered into the list of field 66 of the root child node that has the value of the word. Logic (not shown) in the component 43 of FIG. 1 flags the stored phrase reference where the word has multiple occurrences in the phrase. The flag generated in block 133 is used for this purpose.

At a block 135, a test is made to determine if all of the phrase codes in the output code table 16 have been processed. If not, a branch is taken to loop back to the block 130 for further processing. If all of the phrase codes have been processed, a branch is taken to a block 136 to terminate the processing.

The process of FIG. 6 is exemplified in FIG. 3 by the arrows 80–82. The phrase "The red fox" is decompressed (block 133) and the individual words of the phrase are located (block 134) at the children of the root. The arrows 80–82 indicate that the code 120 for the phrase is stored in the individual word nodes in fields 66 thereof.

Figure 7:
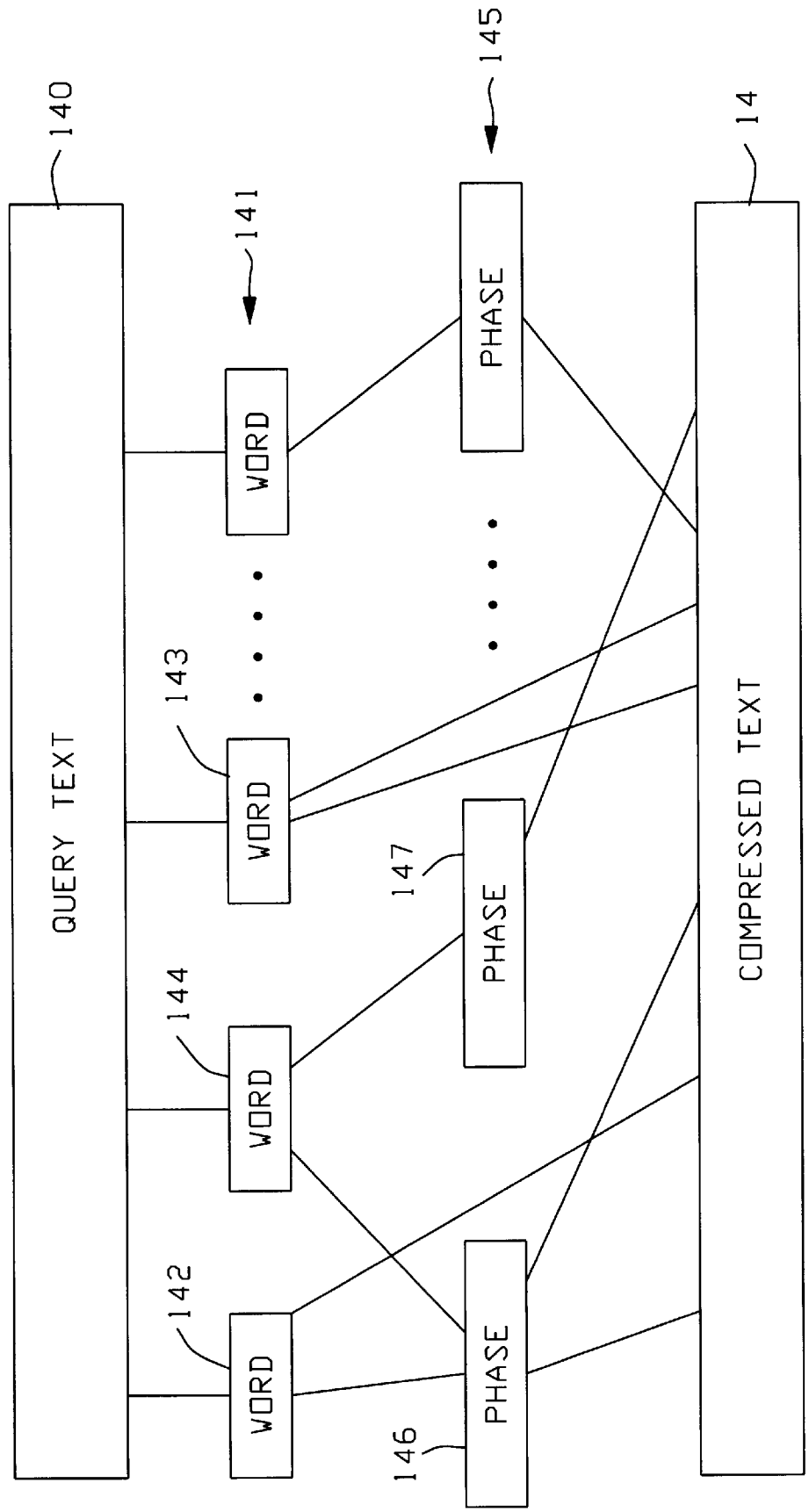
FIG. 7 is a conceptual diagram illustrating query management flow utilizing the system of FIG. 1.

Referring to FIG. 7, with continued reference to FIGS. 1–3, the manner in which a query text accesses the compressed text database via the word and phrase references is schematically illustrated. A query text is represented by reference numeral 140 and the compressed text database by reference numeral 14 as in FIG. 1. The words 141 of the query are found in the searchtree stored in the dictionary 13 utilizing the data compression engine 11. The words are found at the root children nodes and fields 65 thereof provide the list of references to the compressed text 14 where the words are directly located. A word 142 is illustrated as appearing once in compressed text 14, whereas a word 143 is illustrated as appearing twice.

As described above, the words 141 of the query are referenced, via the list of phrase references in field 66 of the root children, to phrases 145 that contain the words. A word 144 is illustrated as appearing in phrases 146 and 147. The phrases reference the compressed text 14 via the list of references to the compressed text contained in field 65 of each phrase as discussed above. The phrase 146 is illustrated as having the compressed code thereof at two locations in the compressed text 14. Since a phrase refers to locations in the compressed text 14 storing the corresponding phrase code, the phrase can be decompressed and text in both directions from the location in the compressed text database 14 where the compressed code for the phrase is stored can be recovered. The decompression is performed as discussed above utilizing the data decompression engine 12 and the searchtree database stored in the dictionary 13. If the query 140 contains a phrase that was encountered during compression, as discussed above with respect to FIG. 4, the query search time is significantly reduced since the phrase is already formed in the searchtree at compression time and will be rapidly found by the data compression engine 11 at query search time.

It is appreciated from the foregoing that after all of the input text is processed in accordance with FIGS. 4 and 6, the dictionary 13 will store, in the described searchtree, all of the phrases parsed from the input. The compressed text database 14 will store the compressed phrase codes corresponding to the stored phrases in the order in which the stored phrases are encountered in the input. Additionally, each stored phrase in the dictionary 13 includes the list of database reference locations in the database 14 at which the corresponding compressed phrase code are stored. The children nodes of the searchtree root include one node for each distinct word encountered in the input text. Each such child node also includes the list of phrase references to the phrases stored in the dictionary 13 that include the word.

As discussed above, a query is applied to an input 47 of FIG. 1 and the words of the query are applied to data compression engine 11 via path 50. The data compression engine 11 accesses the dictionary 13 performing one iteration of blocks 90–93 of FIG. 4 to find all of the locations in the compressed text database 14 that contain each word directly in compressed code form. The lcmp 25 points to the root child that contains the appropriate tree node. The tree node contains the appropriate references to database 14 in field 65 thereof.

Further references to the database 14 of phrases that contain each word are obtained by utilizing the described word access and utilizing the list of phrase references in field 66 of the root child node. If a word appears more than once in a phrase, the reference is flagged as indicated at blocks 133 and 134 of FIG. 6. The phrase references to the database 14 are then found in field 65 of the phrase end node.

For a query phrase input, the data compression engine 11 accesses the searchtree in the dictionary 13 utilizing the blocks 90–93 of FIG. 4 with plural iterations of blocks 91–93. After the last word of the phrase is processed, the lcmp register 25 contains a pointer to the end node of the phrase in the searchtree. Field 65 of this node contains all of the locations in the database 14 that contain the compressed code for the phrase. The flagged inter-word words discussed above with respect to section 46 of FIG. 1 are skipped over in such a search.

Utilizing word and phrase references to the compressed text database 14, the text in both directions of a referenced location can be decompressed for the purposes of query processing. For example, the data compression engine 11 obtains a database reference from: the searchtree in dictionary 13 as described and sends the reference via a path 23 to the database 14. The database 14 is controlled to read a number of compressed codes in a particular direction from the referenced location. These compressed codes are sent via the path 33 to the data decompression engine 12 to recover the original text utilizing the decompression processes of FIG. 5. The path 56 between the data compression engine 11 and the data decompression engine 12 is utilized for coordination and data transfer purposes. The recovered words are returned via the path 56 to the data compression engine 11 and over the results path 51 to the query processing section 46. Query processing 46 then applies appropriate tests to the words in accordance with the query. For example, the query processing 46, in this manner, determines whether one word is within N words of another word.

In addition to receiving recovered words relative to the query, query processing 46 also receives the database 14 references extracted pursuant to the query as discussed above. These results are passed to query processing 46 on the path 51. Query processing 46 utilizes the returned references to process the relational operators of the query such as AND, OR, and NOT. Query processing 46 applies the logical meaning of the relational operators to the returned database references. All of the references returned with respect to one word and all of the references returned with respect to another word are logically analyzed to obtain the appropriate response to the query. For example, if the query is word1 AND word2, query processing 46 searches for a reference to both words within defined boundaries such as the same document or the same record. In the system described, when the references are augmented to contain document information, the query processing section 46 may perform the logical search relative to the documents in a manner to be further discussed.

As an alternative to the above, query processing 46 may also manage a phrase by considering the words of the phrase as separated by the relational operator WITHIN (1).

Figure 8:
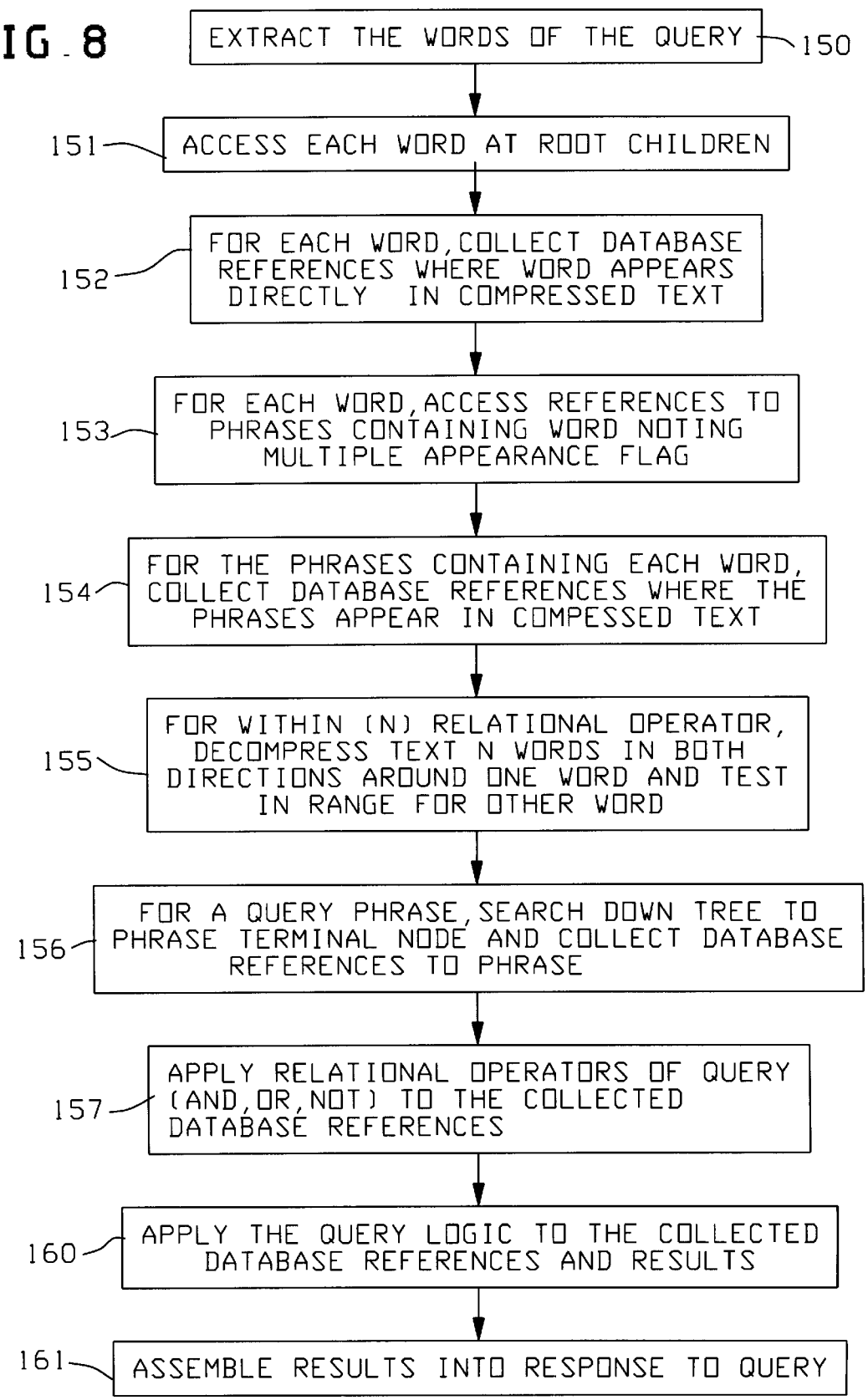
FIG. 8 is a flow chart diagram exemplifying query management utilizing the system of FIG. 1.

Referring to FIG. 8, with continued reference to FIGS. 1–3, a flow chart exemplifying query management utilizing the system of FIG. 1 is illustrated. At a block 150, the words of the query are extracted and applied to data compression engine 11 on path 50. At a block 151, each word is accessed at the root children nodes as discussed. At a block 152, for each word, the database references are collected where the word appears directly in the compressed text. At a block 153, for each word, the references to the phrases containing the word are accessed noting the occurrence of a multiple appearance flag as discussed above with respect to blocks 133 and 134 of FIG. 6. The multiple appearance flag is utilized by the query processing section 46 in performing WITHIN (N) processing so that each appearance of a word in a phrase is considered. At a block 154, for the phrases containing each word, the database references where the compressed code for the phrases appear in the compressed text are collected.

At a block 155, for the WITHIN (N) relational operator, the compressed text is decompressed N words in both directions around one word and a test in the range for the other word is performed. At a block 156, a query phrase is searched down the searchtree to the phrase terminal node and the database references to the phrase are collected. The flagged inter-word words discussed above with respect to section 46 of FIG. 1 are skipped over in such a search. At a block 157, the relational operators of the query are applied to the collected database references. At a block 160, the overall query logic is applied to the collected database references and to the results of the above-described operations. In performing block 160, the operations of block 157 and the results of block 155 are taken into account. At a block 161, the results are assembled into a response to the query. As discussed above, the response is provided from the query processing section 46 on a path 52.

As described above, when the input text comprises multiple input documents, the document identification information may be cross-referenced to the database references in look-up tables in the sections 46 and 53 of FIG. 1. Alternatively, as the searchtree stored in the dictionary 13 is constructed by the data compression engine 11, the document identification information can be stored together with the list of database references in the field 65. This would be accomplished utilizing a path (not shown) between input text processing 20 and the data compression engine 11 providing the document identification information. The data compression engine 11 would store this information in field 65 of the nodes of the searchtree as the searchtree is constructed pursuant to FIG. 4. In particular, this function would be performed in blocks 96 and 107. The document reference would be inserted together with the compressed text reference. In this manner a query search, as exemplified in FIG. 8, can be performed through the searchtree. of dictionary 13 and the document identification references for the found words and phrases can be directly provided to query processing 46 via the results path 51. In other words, the query search can be made relative to the stored documents.

Although the query processing section 46 of FIG. 1 is illustrated coupled to the data compression engine 11, this function may also be coupled to the data decompression engine 12 to perform the above operations. In a similar manner, the document access section 53 illustrated as coupled to the data decompression engine 12, may instead be coupled to the data compression engine 11.

Although the system of FIG. 1 is illustrated as constructing and utilizing the dictionary 13 at a local site, it is appreciated that the compressed code, generated during the operation of FIG. 4 and outputted on output path 22 could be transmitted to a remote site. At the remote site, the compressed code signals would be utilized to reproduce the dictionary 13. The techniques disclosed in said U.S. Pat. No. 4,558,302 can be utilized for this purpose. The techniques of the non-initialized compression/decompression embodiment of said U.S. Pat. No. 4,558,302 would be utilized and this version of the invention could be used for data communication as schematically illustrated in FIG. 9.

Figure 9:
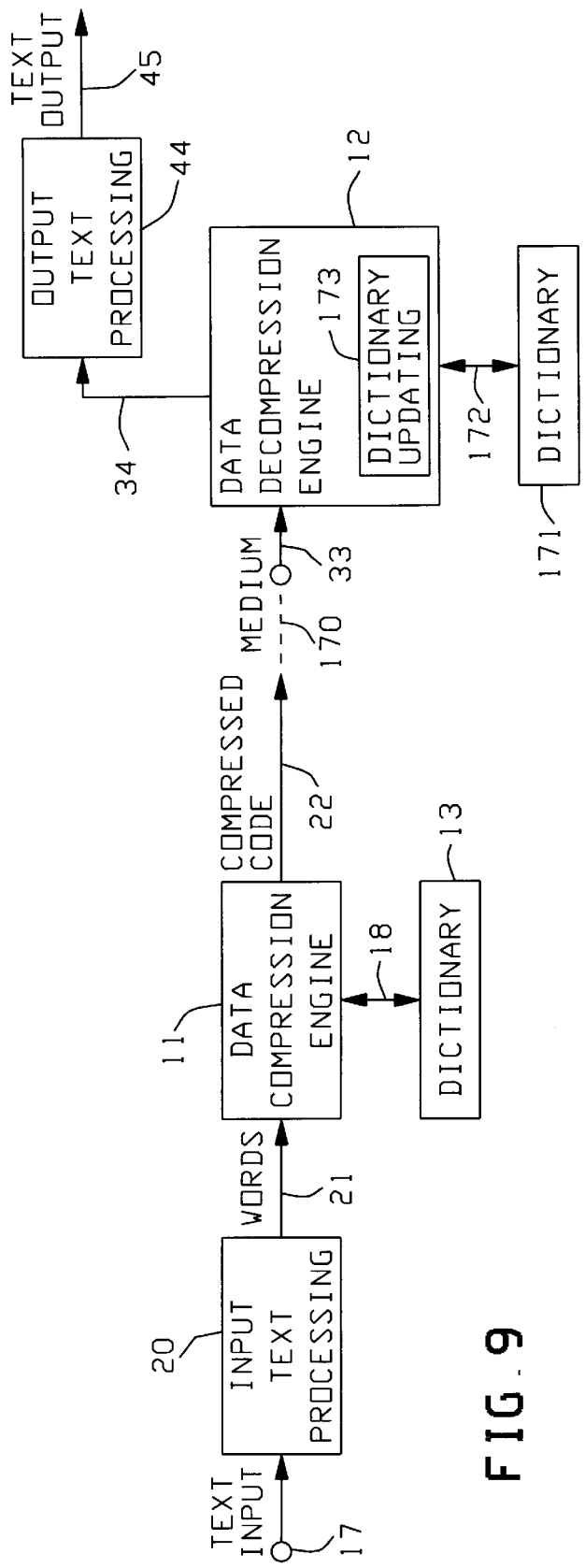
FIG. 9 is a schematic block diagram of a textual data compression/decompression communication system utilizing an aspect of the present invention.

Referring to FIG. 9, with continued reference to FIGS. 1–5, a schematic representation of a data communication system utilizing the word-phrase aspect of the invention is illustrated. Reference numerals utilized in previous figures represent comparable components in FIG. 9. Input text applied at input 17 is processed, as described above, in input text processing 20 and a stream of input textual words is applied to data compression engine 11 via the path 21. The data compression engine 11 interacts with the dictionary 13, as described above, providing a stream of compressed phrase codes on output 22. It is appreciated in the communication embodiment of FIG. 9 that fields 65 and 66 of FIG. 2 are not utilized. Furthermore, FIG. 6 and block 43 of FIG. 1, as well as blocks 96 and 107 of FIG. 4, are not utilized in the FIG. 9 embodiment.

The compressed code on the output 22 is transported via an appropriate medium 170 to input 33 of the data decompression engine 12. The data decompression engine 12 communicates with a dictionary 171 via a path 172. The data decompression engine 12 includes a dictionary updating component 173.

By known techniques, such as those described in detail in said U.S. Pat. No. 4,558,302, the data decompression engine 12 constructs and utilizes the dictionary 171 to decompress the compressed code applied at input 33 to recover the original textual words thereof. The recovered words are applied on output 34. The dictionary 171 is constructed using known techniques by the dictionary updating component 173, tracking the construction of the dictionary 13 in a phrase-by-phrase manner, to maintain the dictionary 171 identical to the dictionary 13. The dictionary updating component 173 includes a code assignment component (not shown) that assigns compressed phrase codes in the manner described above with respect to the code assignment component 24 of FIG. 1 so as to maintain the dictionaries identical. The character-string techniques of said U.S. Pat. No. 4,558,302 are readily adapted to this purpose.

The recovered words on the output 34 are passed through output text processing 44 to provide the recovered text output on the output 45 as described above with respect to FIG. 1.

Prior art techniques may be applied to limit the size of the dictionary 13. For example, the least recently used (LRU) technique of said U.S. Pat. No. 4,814,746 may be utilized.

An alternative approach to controlling dictionary size is to determine a threshold for dictionary fullness and once this level has been attained, only add words to the dictionary that are encountered for the first time, This is achieved in FIG. 4 by by-passing blocks 97, 100 and 101 when the threshold has been reached.

This technique can also be used in two passes. In the first pass, all of the words encountered for the first time are collected and in the second pass the phrases are collected. The second pass stops collecting phrases when the threshold is attained. The first pass may be considered as initializing the dictionary with all of the single word phrases that exist in the input text. This is comparable to the prior art initialization where the dictionary is initialized with all of the single character strings.

The first pass is achieved by utilizing FIG. 4 by-passing blocks 93 and 106. In this manner, only the left hand branch of FIG. 4 is traversed in acquiring all of the distinct words existing in the input text. In the second pass, FIG. 4 is utilized in normal operation until the dictionary fullness threshold is achieved. Thereafter, blocks 97, 100 and 101 are by-passed.

The above-described embodiment was explained in terms of utilizing LZW compression/decompression techniques. It is appreciated that the invention may be embodied utilizing any other dictionary-based compression/decompression procedure. The searchtree was explained in terms of utilizing the child-sibling architecture. It is also appreciated that other tree architectures and search procedures than those described above may be utilized in embodying the invention.

The data compression engine 11 and data decompression engine 12 may be implemented on any suitable computer or microprocessor. For example, the Unisys CWP 5906 Workstation with a Pentium. 90 Mhz CPU may be utilized configured with 40 megabytes of main memory, 2 gigabytes of hard drive, and running Windows NT Workstation 4.0 using Microsoft Visual C++ as the Development platform. The dictionary 13 may be maintained in computer main memory or may be maintained out on the computer disk system. Disk performance may be optimized by using well-known disk caching techniques, such as operating system file system caching. The compressed text database 14 may be embodied utilizing the Windows NT file system.

Using dictionary-based compression and extending the use of the dictionary for textual retrieval results in effective compression of the textual information thereby saving storage space. Additionally, when a query is processed, only the portion of the text referred to by the query needs to be decompressed. The invention provides that the compressed text be decompressed starting at any point and progressing in either direction so that only the minimum required text is decompressed. Furthermore, since dictionary-based compression stores phrases in the dictionary, queries perform more quickly since the phrase that is being queried may be an existing phrase in the dictionary. The use of phrases in a dictionary increases the speed of retrieving textual information.

The invention extends conventional compression/decompression techniques, such as LZW, combining indexing with compression to provide for the efficient storage and retrieval of textual information. The dictionary tree from, for example, the LZW compression technique is augmented with reference information so that all the words and phrases can be located directly in the compressed text. Each distinct word contains references to all of the phrases that contain the word and each phrase contains references to the compressed text where the phrase occurs.

The invention has been described above as including two principal aspects. One aspect is the application of dictionary based data compression/decompression procedures to the processing of textual data utilizing words and phrases rather than characters and strings. The other aspect is the inclusion of compressed database references in the searchtree to be utilized as described. The above preferred embodiment combines both techniques.

It is appreciated, however, that the two principal aspects are separately usable. Dictionary-based compression/decompression can be applied to textual data using words and phrases without the use of compressed database references and the use of compressed database references can be applied to a dictionary-based compression/decompression system that processes characters and strings of characters.

While the invention has been described in its preferred embodiment, it is to be understood that the words which have been used are words of description rather than of limitation and that changes may be made within the purview of the appended claims without departing from the true scope and spirit of the invention in its broader aspects.

We claim:

1. Data compression apparatus for compressing input textual data into compressed phrase codes and storing said compressed phrase codes in a compressed text database at locations thereof, said input textual data comprising a stream of words, said apparatus comprising:

storage means for storing phrases of said words, each said phrase having associated therewith a compressed phrase code and a list of references to locations in said compressed text database whereat said compressed phrase code associated with said phrase is stored, said list of references being stored in said storage means together with said phrase with which said list is associated, means for searching said input textual data by comparing said stream of words to said stored phrases until a longest match therewith is determined, means for providing the compressed phrase code associated with said longest match and storing said compressed phrase code at a location of said compressed text database, means for adding to said list associated with said longest match, a reference to said location of said compressed text database at which said compressed phrase code associated with said longest match is stored, means for entering into said storage means an extended phrase comprising said longest match extended by the next word in said stream of words following said longest match, and means for assigning a compressed phrase code to said extended phrase, said apparatus thereby using the LZW procedure for compressing said stream of words into said compressed phrase codes.

2. The apparatus of claim 1 wherein said phrases are stored in said storage means in a linked tree structure, said linked tree structure including a list of word-to-phrase references indicating, for a particular word, the phrases stored in said storage means that include said particular word.

3. The apparatus of claim 2 wherein said linked tree structure includes tree nodes for storing said words of said phrases, said list of word-to-phrase references for said particular word being stored in a tree node for said particular word.

4. The apparatus of claim 3 wherein each particular tree node includes a parent pointer to a parent node of said particular node and a child pointer to at least one child of said particular node, said tree including a root node and children nodes of said root node, said particular word being stored in one of said children nodes of said root node, said list of word-to-phrase references being stored in said one of said children nodes storing said particular word.

5. The apparatus of claim 4 wherein said phrases are stored as linked paths through said tree nodes, said children nodes of said root node storing initial words of said phrases stored in said storage means, said compressed phrase code associated with a particular phrase being associated with an end node of said particular phrase, said end node storing the last word of said particular phrase, said end node storing said list of references to locations in said compressed text database at which the compressed phrase code of said particular phrase is stored.

6. The apparatus of claim 5 further including means for detecting when a word of said stream of words is encountered for the first time, said means for entering being operative for entering into said storage means said extended phrase comprising a child node of said root node, said child node storing said word encountered for the first time, said child node of said root node thereby comprising a single word phrase, said means for assigning being operative for assigning a compressed phrase code to said single word phrase, said means for providing being operative for providing the compressed phrase code assigned to said single word phrase and storing said compressed phrase code at a location of said compressed text database, said single word phrase having associated therewith a list of references to locations in said compressed text database, said means for adding operative for placing in said list associated with said single word phrase, a reference to said location in said compressed text database at which said compressed phrase code assigned to said single word phrase is stored.

7. The apparatus of claim 5 wherein said storage means comprises a dictionary storing said phrases in said linked tree structure.

8. The apparatus of claim 7 further including data decompression apparatus for use with said data compression apparatus for decompressing a compressed phrase code to recover the words of the phrase associated therewith, said data decompression apparatus comprising:

means for accessing the end node of said phrase in said dictionary utilizing said compressed phrase code, means for following said parent pointers up said tree along one of said linked paths through said tree nodes from said end node of said phrase to the initial node of said phrase collecting the words that comprise the phrase from the nodes along said linked path.

9. The apparatus of claim 8 further including means for reversing the order of said collected words to recover said words of said phrase.

10. The apparatus of claim 1 further including query processing apparatus for use with said data compression apparatus for processing a textual query, said textual query including query words and relational operators relating at least some of said query words to one another, said query processing apparatus comprising:

means for accessing each said list of references associated with a phrase stored in said storage means that includes at least one of said query words, thereby collecting compressed database references to locations in said compressed text database storing compressed phrase codes associated with said stored phrases containing said query words, and means for applying said relational operators to said collected compressed database references in accordance with said textual query.

11. The apparatus of claim 2 further including query processing apparatus for use with said data compression apparatus for processing a textual query, said textual query including query words and relational operators relating at least some of said query words to one another, said query processing apparatus comprising:

means for accessing in said storage means, for each said query word, said list of word-to-phrase references indicating the particular phrases stored in said storage means that include said query word, thereby providing phrase references to said particular phrases, means for accessing in said storage means each said list of references to locations in said compressed text database associated with each of said particular phrases, thereby collecting compressed database references to locations in said compressed text database whereat compressed phrase codes associated with said particular phrases are stored, and means for applying said relational operators to said collected compressed database references in accordance with said textual query.

12. The apparatus of claim 5 further including query processing apparatus for use with said data compression apparatus for processing a textual query, said textual query including a query phrase of query words and at least one relational operator relating said query phrase to said textual query, said query processing apparatus comprising:

means for searching said query phrase by comparing said query words to said stored phrases to find a matching phrase in said storage means, said matching phrase having an end node, means for accessing said list, stored in said end node, of references to locations in said compressed text database whereat the compressed phrase code associated with said matching phrase is stored, thereby collecting compressed database references to said locations in said compressed text database whereat said compressed phrase code associated with said query phrase is stored, and means for applying said relational operator to said collected compressed database references in accordance with said textual query.

13. The apparatus of claim 8 further including query processing apparatus for use with said data compression apparatus and said data decompression apparatus for processing a textual query, said textual query including query words and a relational operator relating at least some of said query words to one another, said query processing apparatus comprising:

means for accessing said dictionary using said query words to obtain at least one reference to at least one location in said compressed text database storing a particular compressed phrase code associated with a particular phrase including at least one of said query words, said data decompression apparatus operative to recover the words of said particular phrase in response to said particular compressed phrase code, and means for applying said relational operator to said recovered words of said particular phrase in accordance with said textual query.

14. The query processing apparatus of claim 13 wherein said data decompression apparatus is operative for decompressing at least one further compressed phrase code adjacent said particular compressed phrase code in said compressed text database, thereby recovering the words of a further particular phrase associated with said further compressed phrase code, and said means for applying further operative for applying said relational operator to said recovered words of said particular and further particular phrases in accordance with said textual query.

15. For use in a system for storing and retrieving textual data, said textual data comprising a sequence of words, said system including a dictionary for storing phrases of said words, said phrases having respective compressed phrase codes associated therewith, said phrases being stored in said dictionary in a linked tree structure including tree nodes for storing said words of said phrases, each particular tree node including a parent pointer to a parent node of said particular node, said phrases being stored as linked paths through said tree nodes, each said stored phrase having an initial node storing an initial word of said stored phrase and an end node storing a last word of said stored phrase, said compressed phrase code associated with said stored phrase being associated with said end node of said stored phrase; data decompression apparatus for decompressing a compressed phrase code to recover the words of the phrase associated therewith, said data decompression apparatus comprising:

means for accessing the end node of said phrase in said dictionary utilizing said compressed phrase code associated therewith, means for following said parent pointers up said tree along one of said linked paths through said tree nodes from said end node of said phrase to said initial node of said phrase collecting the words that comprise the phrase from the nodes along said linked path, said system including a compressed text database for storing said compressed phrase codes at locations thereof, each said phrase stored in said dictionary having associated therewith a list of references to locations in said compressed text database whereat said compressed phrase code associated with said phrase is stored, said data decompression apparatus being operative to retrieve compressed phrase codes from said compressed text database in response to said references and, utilizing said dictionary, decompressing said retrieved compressed phrase codes into the words of the phrases with which said retrieved compressed phrase codes are associated.

16. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored; query processing apparatus for processing a textual query, said textual query including query words and relational operators relating at least some of said query words to one another, said query processing apparatus comprising:

means for accessing each said list of references associated with a phrase stored in said dictionary that includes at least one of said query words, thereby collecting compressed database references to locations in said compressed text database storing compressed phrase codes associated with said stored phrases containing said query words, and means for applying said relational operators to said collected compressed database references in accordance with said textual query.

17. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored; query processing apparatus for processing a textual query, said textual query including a query phrase of query words and at least one relational operator relating said query phrase to said textual query, said query processing apparatus comprising:

means for searching said query phrase by comparing said query words to said stored phrases to find a matching phrase in said dictionary, means for accessing said list, associated with said matching phrase, of references to locations in said compressed text database whereat the compressed phrase code associated with said matching phrase is stored, thereby collecting compressed database references to said locations in said compressed text database whereat said compressed phrase code associated with said query phrase is stored, and means for applying said relational operator to said collected compressed database references in accordance with said textual query.

18. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored, said system including data decompression apparatus for decompressing a compressed phrase code to recover the words of the phrase associated therewith; query processing apparatus for processing a textual query, said textual query including query words and a relational operator relating at least some of said query words to one another, said query processing apparatus comprising:

means for accessing said dictionary using said query words to obtain at least one reference to at least one location in said compressed text database storing a particular compressed phrase code associated with a particular phrase including at least one of said query words, said data decompression apparatus operative to recover the words of said particular phrase in response to said particular compressed phrase code, said data decompression apparatus being operative for decompressing at least one further compressed phrase code adjacent said particular compressed phrase code in said compressed text database, thereby recovering the words of a further particular phrase associated with said further compressed phrase code, and means for applying said relational operator to said recovered words of said particular and further particular phrases in accordance with said textual query.

19. Data compression apparatus for compressing a stream of words comprising input textual data into a stream of compressed phrase codes comprising:

compression storage means for storing phrases of said words, each said phrase having a compressed phrase code associated therewith, means for searching said input textual data by comparing said stream of words to said stored phrases until the longest match therewith is determined, means for entering into said storage means an extended phrase comprising said longest match extended by the next word in said stream of words following said longest match, means for assigning a compressed phrase code to said extended phrase, and means for providing the compressed phrase code associated with said longest match so as to provide said stream of compressed phrase codes, further including data decompression apparatus for decompressing said stream of compressed phrase codes to recover the words of the phrases associated therewith, said data decompression apparatus comprising:

decompression storage means identical to said compression storage means for storing said phrases of said words stored in said compression storage means, each said phrase stored in said decompression storage means having associated therewith a compressed phrase code identical to the compressed phrase code associated with an identical phrase stored in said compression storage means, said compression storage means and decompression storage means each having said phrases stored therein in a linked tree structure including tree nodes for storing said words of said phrases, each particular tree node including a parent pointer to a parent node of said particular node, said phrases being stored as linked paths through said tree nodes, each said stored phrase having an initial node storing an initial word of said stored phrase and an end node storing a last word of said stored phrase, said compressed phrase code associated with said stored phrase being associated with said end node of said stored phrase, and means for updating said decompression storage means to remain identical to said compression storage means by entering into said decompression storage means an extended phrase identical to said extended phrase entered into said compression storage means and assigning a compressed phrase code to said extended phrase entered into said decompression storage means that is identical to said compressed phrase code assigned to said extended phrase entered into said compression storage means.

20. The data decompression apparatus of claim 19 further comprising:

means for accessing an end node of a phrase stored in said decompression storage means utilizing the compressed phrase code associated with said end node, means for following said parent pointers up said tree along one of said linked paths, through said tree nodes from said end node of said phrase to said initial node of said phrase collecting the words that comprise the phrase from the nodes along said linked path.

21. Data compression apparatus for compressing input data into compressed string codes and storing said compressed string codes in a compressed database at locations thereof, said input data comprising a stream of characters, said apparatus comprising:

storage means for storing strings of said characters, each said string having associated therewith a compressed string code and a list of references to locations in said compressed database whereat said compressed string code associated with said string is stored, means for searching said input data by comparing said stream of characters to said stored strings until the longest match therewith is determined, means for providing the compressed string code associated with said longest match and storing said compressed string code at a location of said compressed database, means for adding to said list associated with said longest match, a reference to said location in said compressed database at which said compressed string code associated with said longest match is stored, means for entering into said storage means an extended string comprising said longest match extended by the next character in said stream of characters following said longest match, and means for assigning a compressed string code to said extended string.

22. The data compression apparatus of claim 21 wherein said strings are stored in said storage means in a linked tree structure including tree nodes for storing said characters of said strings, each particular tree node including a parent pointer to a parent node of said particular node, said strings being stored as linked paths through said tree nodes, each said stored string having an initial node storing an initial character of said stored string and an end node storing a last character of said stored string, said compressed string code associated with said stored string being associated with said end node thereof, said end node storing said list of references to locations in said compressed database at which the compressed string code of said stored string is stored.

23. The apparatus of claim 22 further including data decompression apparatus for use with said data compression apparatus for decompressing a compressed string code to recover the characters of the string associated therewith, said data decompression apparatus comprising:

means for accessing the end node of said string in said storage means utilizing said compressed string code associated therewith, means for following said parent pointers up said tree along one of said linked paths through said tree nodes from said end node of said string to said initial node of said string collecting the characters that comprise the string from the nodes along said linked path.

24. The apparatus of claim 23 further including query processing apparatus for use with said data compression apparatus and the data decompression apparatus for processing a textual query, said textual query including query words and relational operators relating at least some of said query words to one another, said query processing apparatus comprising:

means for accessing each said list of references associated with a string stored in said storage means that matches one of said query words, thereby collecting compressed database references to locations in said compressed database storing compressed string codes associated with stored strings matching said query words, and means for applying said relational operators to said collected compressed database references in accordance with said textual query.

25. The apparatus of claim 15 further including text accessing apparatus for use with said data decompression apparatus for retrieving particular text from said compressed text database, said text accessing apparatus comprising:

means for providing references to said compressed text database to locations in said compressed text database whereat compressed phrase codes associated with phrases comprising said particular text are stored, said data decompression apparatus being operative to decompress said stored compressed phrase codes to recover the words of the phrases associated therewith, thereby retrieving said particular text.

26. A data compression method for compressing input textual data into compressed phrase codes and storing said compressed phrase codes in a compressed text database at locations thereof, said input textual data comprising a stream of words, said method comprising:

storing phrases of said words in a dictionary, each said phrase having associated therewith a compressed phrase code and a list of references to locations in said compressed text database whereat said compressed phrase code associated with said phrase is stored, said list of references being stored in said dictionary together with said phrase with which said list is associated, searching said input textual data by comparing said stream of words to said stored phrases until a longest match therewith is determined, providing the compressed phrase code associated with said longest match and storing said compressed phrase code at a location of said compressed text database, adding to said list associated with said longest match, a reference to said location of said compressed text database at which said compressed phrase code associated with said longest match is stored, entering into said dictionary an extended phrase comprising said longest match extended by the next word in said stream of words following said longest match, and assigning a compressed phrase code to said extended phrase, said method thereby using the LZW procedure for compressing said stream of words into said compressed phrase codes.

27. The method of claim 26 wherein said storing step includes storing said phrases in said dictionary in a linked tree structure, said method further comprising:

including, in said linked tree structure, a list of word-to-phrase references indicating, for a particular word, the phrases stored in said dictionary that include said particular word.

28. The method of claim 27 wherein said linked tree structure includes tree nodes for storing said words of said phrases, said including step comprising:

including said list of word-to-phrase references for said particular word in a tree node for said particular word.

29. The method of claim 28 wherein each particular tree node includes a parent pointer to a parent node of said particular node and a child pointer to at least one child of said particular node, said tree including a root node and children nodes of said root node, said particular word being stored in one of said children nodes of said root node, said including step comprising:

including said list of word-to-phrase references in said one of said children nodes storing said particular word.

30. The method of claim 29 wherein said said phrases are stored as linked paths through said tree nodes, said children nodes of said root node storing initial words of said phrases stored in said dictionary, said compressed phrase code associated with a particular phrase being associated with an end node of said particular phrase, said end node storing the last word of said particular phrase, said method including:

storing, in said end node, said list of references to locations in said compressed text database at which the compressed phrase code of said particular phrase is stored.

31. The method of claim 30 further including detecting when a word of said stream of words is encountered for the first time, said entering step including entering into said dictionary said extended phrase comprising a child node of said root node, said child node storing said word encountered for the first time, said child node of said root node thereby comprising a single word phrase, said assigning step including assigning a compressed phrase code to said single word phrase, said providing step including providing the compressed phrase code assigned to said single word phrase and storing said compressed phrase code at a location of said compressed text database, said single word phrase having associated therewith a list of references to locations in said compressed text database, said adding step including placing in said list associated with said single word phrase, a reference to said location in said compressed text database at which said compressed phrase code assigned to said single word phrase is stored.

32. The method of claim 30 further including a data decompression method for use with said data compression method for decompressing a compressed phrase code to recover the words of the phrase associated therewith, said data decompression method comprising:

accessing the end node of said phrase in said dictionary utilizing said compressed phrase code, following said parent pointers up said tree along one of said linked paths through said tree nodes from said end node of said phrase to the initial node of said phrase collecting the words that comprise the phrase from the nodes along said linked path.

33. The method of claim 32 further including reversing the order of said collected words to recover said words of said phrase.

34. The method of claim 26 further including a query processing method for use with said data compression method for processing a textual query, said textual query including query words and relational operators relating at least some of said query words to one another, said query processing method comprising:

accessing each said list of references associated with a phrase stored in said dictionary that includes at least one of said query words, thereby collecting compressed database references to locations in said compressed text database storing compressed phrase codes associated with said stored phrases containing said query words, and applying said relational operators to said collected compressed database references in accordance with said textual query.

35. The method of claim 27 further including a query processing method for use with said data compression method for processing a textual query, said textual query including query words and relational operators relating at least some of said query words to one another, said query processing method comprising:

accessing in said dictionary, for each said query word, said list of word-to-phrase references indicating the particular phrases stored in said dictionary that include said query word, thereby providing phrase references to said particular phrases, accessing in said dictionary each said list of references to locations in said compressed text database associated with each of said particular phrases, thereby collecting compressed database references to locations in said compressed text database whereat compressed phrase codes associated with said particular phrases are stored, and applying said relational operators to said collected compressed database references in accordance with said textual query.

36. The method of claim 30 further including a query processing method for use with said data compression method for processing a textual query, said textual query including a query phrase of query words and at least one relational operator relating said query phrase to said textual query, said query processing method comprising:

searching said query phrase by comparing said query words to said stored phrases to find a matching phrase in said dictionary, said matching phrase having an end node, accessing said list, stored in said end node, of references to locations in said compressed text database whereat the compressed phrase code associated with said matching phrase is stored, thereby collecting compressed database references to said locations in said compressed text database whereat said compressed phrase code associated with said query phrase is stored, and applying said relational operator to said collected compressed database references in accordance with said textual query.

37. The method of claim 32 further including a query processing method for use with said data compression method and the data decompression method for processing a textual query, said textual query including query words and a relational operator relating at least some of said query words to one another, said query processing method comprising:

accessing said dictionary using said query words to obtain at least one reference to at least one location in said compressed text database storing a particular compressed phrase code associated with a particular phrase including at least one of said query words, recovering the words of said particular phrase in response to said particular compressed phrase code using said data decompression method, and applying said relational operator to said recovered words of said particular phrase in accordance with said textual query.

38. The query processing method of claim 37 wherein said data decompression method includes decompressing at least one further compressed phrase code adjacent said particular compressed phrase code in said compressed text database, thereby recovering the words of a further particular phrase associated with said further compressed phrase code, and said applying step further comprising applying said relational operator to said recovered words of said particular and further particular phrases in accordance with said textual query.

39. For use in a system for storing and retrieving textual data, said textual data comprising a sequence of words, said system including a dictionary for storing phrases of said words, said phrases having respective compressed phrase codes associated therewith, said phrases being stored in said dictionary in a linked tree structure including tree nodes for storing said words of said phrases, each particular tree node including a parent pointer to a parent node of said particular node, said phrases being stored as linked paths through said tree nodes, each said stored phrase having an initial node storing an initial word of said stored phrase and an end node storing a last word of said stored phrase, said compressed phrase code associated with said stored phrase being associated with said end node of said stored phrase, a data decompression method for decompressing a compressed phrase code to recover the words of the phrase associated therewith, said data decompression method comprising:

accessing the end node of said phrase in said dictionary utilizing said compressed phrase code associated therewith, following said parent pointers up said tree along one of said linked paths through said tree nodes from said end node of said phrase to said initial node of said phrase collecting the words that comprise the phrase from the nodes along said linked path, said system including a compressed text database for storing said compresses codes at locations thereof and each said phrase stored in said dictionary has associated therewith a list of references to locations in said compressed text, database whereat said compressed phrase code associated with said phrase is stored, and, retrieving compressed phrase codes from said compressed text database in response to said references and, utilizing said dictionary, decompressing said retrieved compressed phrase codes into the words of the phrases with which said retrieved compressed phrase codes are associated.

40. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored, a query processing method for processing a textual query, said textual query including query words and relational operators relating at least some of said query words to one another, said query processing method comprising:

accessing each said list of references associated with a phrase stored in said dictionary that includes at least one of said query words, thereby collecting compressed database references to locations in said compressed text database storing compressed phrase codes associated with said stored phrases containing said query words, and applying said relational operators to said collected compressed database references in accordance with said textual query.

41. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored, a query processing method for processing a textual query, said textual query including a query phrase of query words and at least one relational operator relating said query phrase to said textual query, said query processing method comprising:

searching said query phrase by comparing said query words to said stored phrases to find a matching phrase in said dictionary, accessing said list, associated with said matching phrase, of references to locations in said compressed text database whereat the compressed phrase code associated with said matching phrase is stored, thereby collecting compressed database references to said locations in said compressed text database whereat said compressed phrase code associated with said query phrase is stored, and applying said relational operator to said collected compressed database references in accordance with said textual query.

42. For use in a system for storing and retrieving textual data, said textual data comprising a sequence of words, said system including a dictionary for storing phrases of said words, said phrases having respective compressed phrase codes associated therewith, said system including a compressed text database for storing said compressed phrase codes at locations thereof, each said phrase stored in said dictionary having associated therewith a list of references to locations in said compressed text database whereat said compressed phrase code associated with said phrase is stored, said system including data decompression apparatus for decompressing a compressed phrase code to recover the words of the phrase associated therewith, a query processing method for processing a textual query, said textual query including query words and a relational operator relating at least some of said query words to one another, said query processing method comprising:

accessing said dictionary using said query words to obtain at least one reference to at least one location in said compressed text database storing a particular compressed phrase code associated with a particular phrase including at least one of said query words, recovering the words of said particular phrase in response to said particular compressed phrase code using said data decompression apparatus, decompressing, using said data decompression apparatus, at least one further compressed phrase code adjacent said particular compressed phrase code in said compressed text database, thereby recovering the words of a further particular phrase associated said further compressed phrase code, and applying said relational operator to said recovered words of said particular and further particular phrases in accordance with said textual query.

43. A data compression method for compressing a stream of words comprising input textual data into a stream of compressed phrase codes comprising:

storing phrases of said words in a compression dictionary, each said phrase having a compressed phrase code associated therewith, searching said input textual data by comparing said stream of words to said stored phrases until the longest match therewith is determined, entering into said compression dictionary an extended phrase comprising said longest match extended by the next word in said stream of words following said longest match, assigning a compressed phrase code to said extended phrase, and providing the compressed phrase code associated with said longest match so as to provide said stream of compressed phrase codes, further including a data decompression method for decompressing said stream of compressed phrase codes to recover the words of the phrases associated therewith, said data decompression method comprising:

storing said phrases of said words stored in said compression dictionary in a decompression dictionary identical to said compression dictionary, each said phrase stored in said decompression dictionary having associated therewith a compressed phrase code identical to the compressed phrase code associated with an identical phrase stored in said compression dictionary, said phrases being stored in each of said compression dictionary and decompression dictionary in a linked tree structure including tree nodes for storing said words of said phrases, each particular tree node including a parent pointer to a parent node of said particular node, said phrases being stored as linked paths through said tree nodes, each said stored phrase having an initial node storing an initial word of said stored phrase and an end node storing a last word of said stored phrase, said compressed phrase code associated with said stored phrase being associated with said end node of said stored phrase, and updating said decompression dictionary to remain identical to said compression dictionary by entering into said decompression dictionary an extended phrase identical to said extended phrase entered into said compression dictionary and assigning a compressed phrase code to said extended phrase entered into said decompression dictionary that is identical to said compressed phrase code assigned to said extended phrase entered into said compression dictionary.

44. The data decompression method of claim 43 further comprising:

accessing an end node of a phrase stored in said decompression dictionary utilizing the compressed phrase code associated with said end node, following said parent pointers up said tree along one of said linked paths through said tree nodes from said end node of said phrase to said initial node of said phrase collecting the words that comprise the phrase from the nodes along said linked path.

45. A data compression method for compressing input data into compressed string codes and storing said compressed string codes in a compressed database at locations thereof, said input data comprising a stream of characters, said method comprising:

storing strings of said characters in a dictionary, each said string having associated therewith a compressed string code and a list of references to locations in said compressed database whereat said compressed string code associated with said string is stored, searching said input data by comparing said stream of characters to said stored strings until the longest match therewith is determined, providing the compressed string code associated with said longest match and storing said compressed string code at a location of said compressed database, adding to said list associated with said longest match, a reference to said location in said compressed database at which said compressed string code associated with said longest match is stored, entering into said dictionary an extended string comprising said longest match extended by the next character in said stream of characters following said longest match, and assigning a compressed string code to said extended string.

46. The data compression method of claim 45 wherein said strings are stored in said dictionary in a linked tree structure including tree nodes for storing said characters of said strings, each particular tree node including a parent pointer to a parent node of said particular node, said strings being stored as linked paths through said tree nodes, each said stored string having an initial node storing an initial character of said stored string and an end node storing a last character of said stored string, said compressed string code associated with said stored string being associated with said end node thereof, said method including:

storing, in said end node, said list of references to locations in said compressed database at which the compressed string code of said stored string is stored.

47. The method of claim 46 further including a data decompression method for use with said data compression method for decompressing a compressed string code to recover the characters of the string associated therewith, said data decompression method comprising:

accessing the end node of said string in said dictionary utilizing said compressed string code associated therewith, following said parent pointers up said tree along one of said linked paths through said tree nodes from said end node of said string to said initial node of said string collecting the characters that comprise the string from the nodes along said linked path.

48. The method of claim 47 further including a query processing method for use with said data compression method and the data decompression method for processing a textual query, said textual query including query words and relational operators relating at least some of said query words to one another, said query processing method comprising:

accessing each said list of references associated with a string stored in said dictionary that matches one of said query words, thereby collecting compressed database references to locations in said compressed database storing compressed string codes associated with stored strings matching said query words, and applying said relational operators to said collected compressed database references in accordance with said textual query.

49. The method of claim 39 further including a text accessing method for use with said data decompression method for retrieving particular text from said compressed text database, said text accessing method comprising:

providing references to said compressed text database to locations in said compressed text database whereat compressed phrase codes associated with phrases comprising said particular text are stored, decompressing, using said data decompression method, said stored compressed phrase codes to recover the words of the phrases associated therewith, thereby retrieving said particular text.

* * * * *